United States Patent
Yilmaz

(10) Patent No.: US 11,069,770 B2
(45) Date of Patent: Jul. 20, 2021

(54) CARRIER INJECTION CONTROL FAST RECOVERY DIODE STRUCTURES

(71) Applicant: Power Semiconductor, Gilroy, CA (US)

(72) Inventor: Hamza Yilmaz, Gilroy, CA (US)

(73) Assignee: IPOWER SEMICONDUCTOR, Gilroy, CA (US)

( * ) Notice: Subject to any disclaimer, the term of this patent is extended or adjusted under 35 U.S.C. 154(b) by 0 days.

(21) Appl. No.: 16/450,351

(22) Filed: Jun. 24, 2019

(65) Prior Publication Data

US 2020/0105866 A1    Apr. 2, 2020

Related U.S. Application Data

(60) Provisional application No. 62/739,820, filed on Oct. 1, 2018.

(51) Int. Cl.
| | |
|---|---|
| *H01L 29/06* | (2006.01) |
| *H01L 29/66* | (2006.01) |
| *H01L 29/86* | (2006.01) |
| *H01L 29/73* | (2006.01) |
| *H01L 29/861* | (2006.01) |
| *H01L 29/739* | (2006.01) |

(52) U.S. Cl.
CPC ...... *H01L 29/0619* (2013.01); *H01L 29/0649* (2013.01); *H01L 29/66136* (2013.01); *H01L 29/8613* (2013.01); *H01L 29/7395* (2013.01); *H01L 29/7396* (2013.01); *H01L 2924/13055* (2013.01)

(58) Field of Classification Search
CPC ............ H01L 29/0619; H01L 29/0649; H01L 29/66136; H01L 29/8613; H01L 29/7395; H01L 29/7396; H01L 29/0664; H01L 2924/13055
See application file for complete search history.

(56) References Cited

U.S. PATENT DOCUMENTS 9,111,769 B2 *  8/2015  Aketa ................. H01L 29/0619
9,184,268 B2 * 11/2015  Yoshikawa ......... H01L 29/7397
(Continued)

FOREIGN PATENT DOCUMENTS

CN        110970485 A      4/2020

*Primary Examiner* — Ida M Soward
(74) *Attorney, Agent, or Firm* — Halit N. Yakupoglu

(57) ABSTRACT

Semiconductor devices and methods of fabrication are provided. The semiconductor device includes a Charge Injection Controlled (CIC) Fast Recovery Diode (FRD) to control charge injection by lowering carrier storage. The device can have a first conductivity type semiconductor substrate, and a drift region that includes a doped buffer region, a doped middle region and a doped field stop region or carrier storage region. The device can also include a second conductivity type shield region including a deep junction encircling (or substantially laterally beneath) the buffer region and a second conductivity type shallow junction anode region in electrical contact with a second conductivity type anode electrode. The deep junction can have a range of doping concentrations surrounding the buffer regions to deplete buffer charge laterally as well as vertically to prevent premature device breakdown. The first conductivity type may be N type and the second conductivity type may be P type.

19 Claims, 45 Drawing Sheets

(56) References Cited

U.S. PATENT DOCUMENTS

| | | | | |
|---|---|---|---|---|
| 9,595,608 B2* | 3/2017 | Kumagai | ............ | H01L 29/0684 |
| 9,859,407 B2* | 1/2018 | Tang | ................... | H01L 29/0696 |
| 9,929,260 B2* | 3/2018 | Naito | .................. | H01L 27/0664 |
| 10,157,979 B2* | 12/2018 | Ward | ................ | H01L 29/66712 |
| 10,164,078 B2* | 12/2018 | Udrea | ................ | H01L 29/0804 |
| 10,535,761 B2* | 1/2020 | Naito | .................. | H01L 29/1004 |
| 10,559,682 B2* | 2/2020 | Naito | .................. | H01L 29/0834 |
| 2015/0364584 A1* | 12/2015 | Ryu | ........................ | H01L 29/36 |
| | | | | 257/139 |
| 2017/0213908 A1* | 7/2017 | Fursin | ................ | H01L 29/0615 |
| 2018/0069075 A1* | 3/2018 | Naito | .................. | H01L 29/7397 |
| 2018/0097094 A1* | 4/2018 | Naito | .................. | H01L 29/0696 |
| 2018/0350962 A1* | 12/2018 | Naito | ................... | H01L 21/324 |
| 2019/0074367 A1* | 3/2019 | Naito | ................. | H01L 29/4236 |
| 2019/0252533 A1* | 8/2019 | Naito | ................. | H01L 29/0696 |
| 2020/0161457 A1* | 5/2020 | Takahashi | ........... | H01L 29/8613 |
| 2021/0057556 A1* | 2/2021 | Yilmaz | .............. | H01L 27/0716 |

* cited by examiner

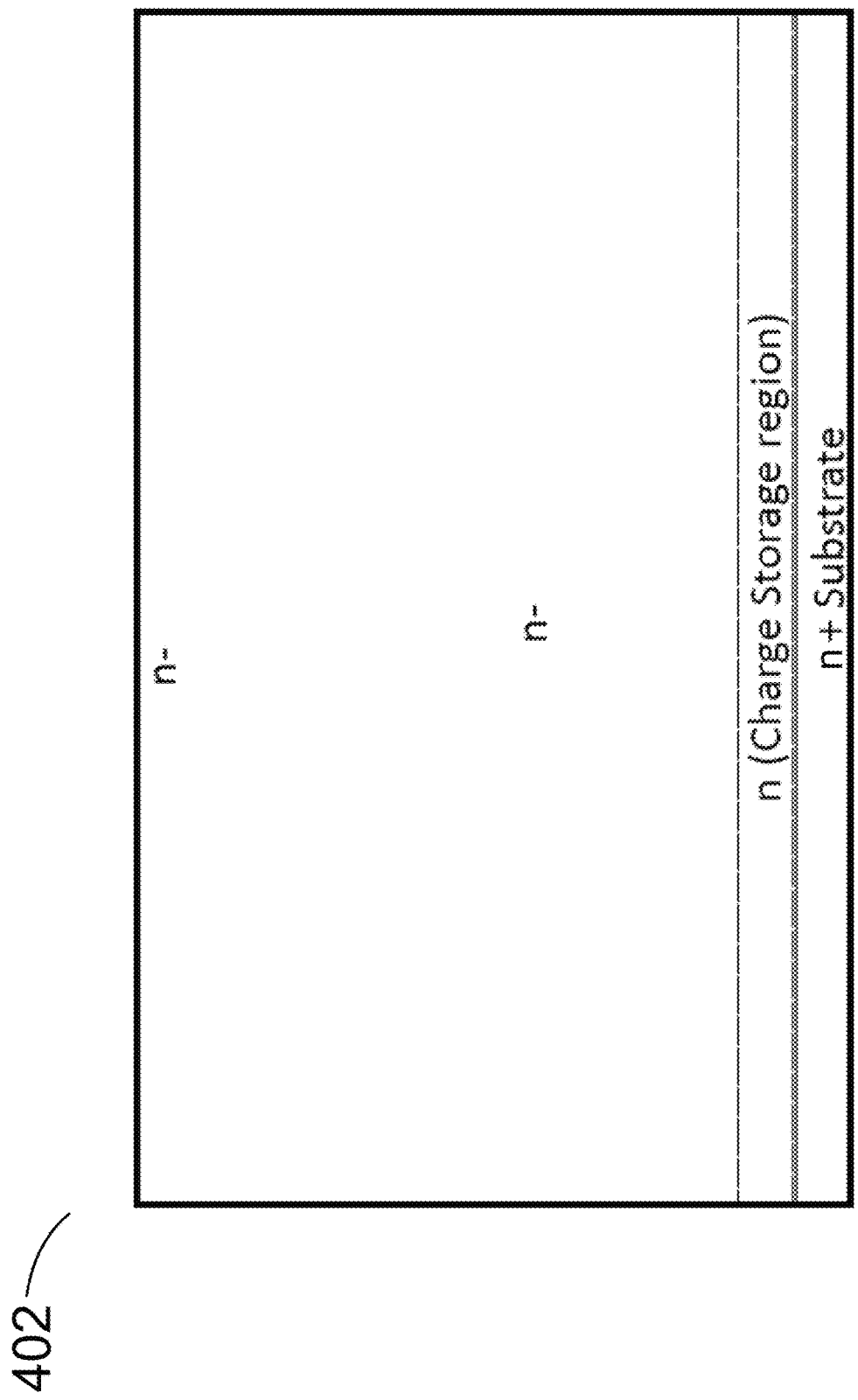
FIG. 4A1

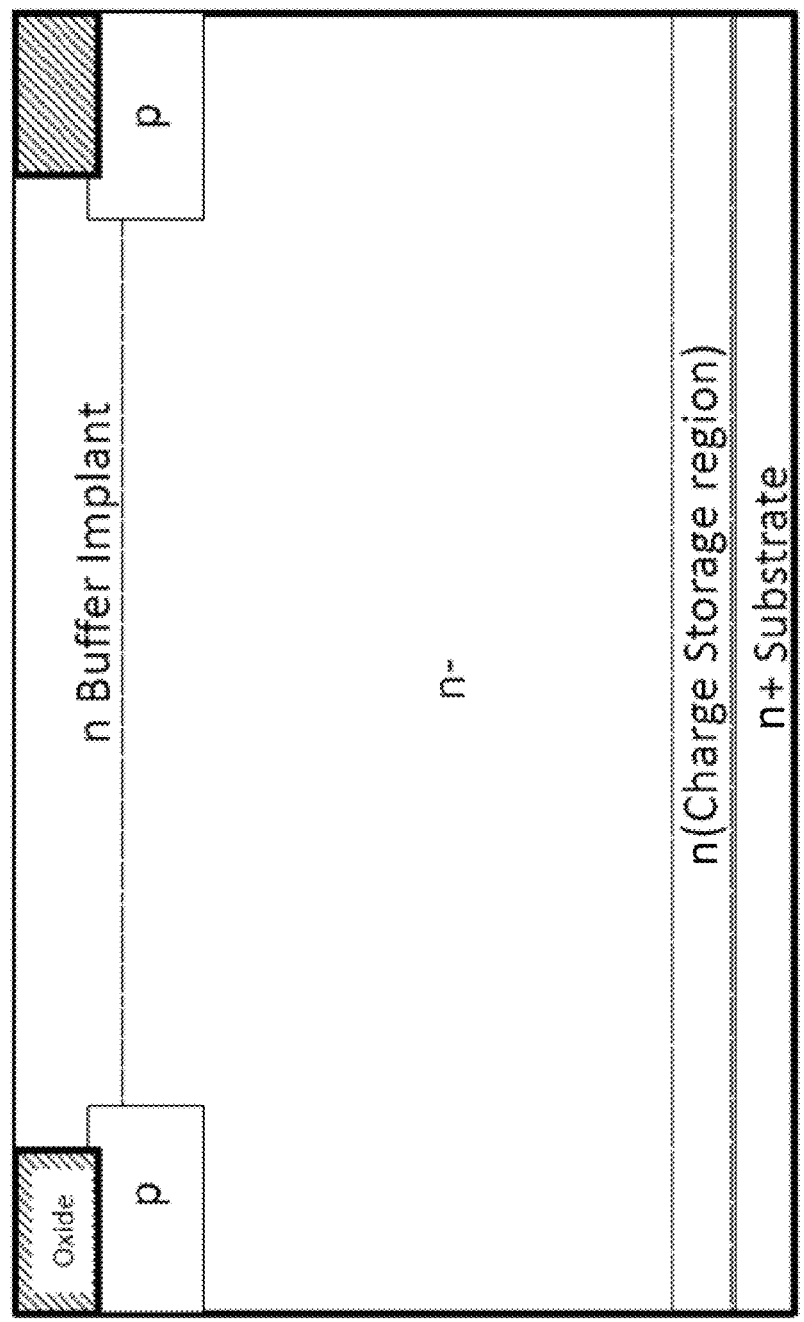
FIG. 4B1

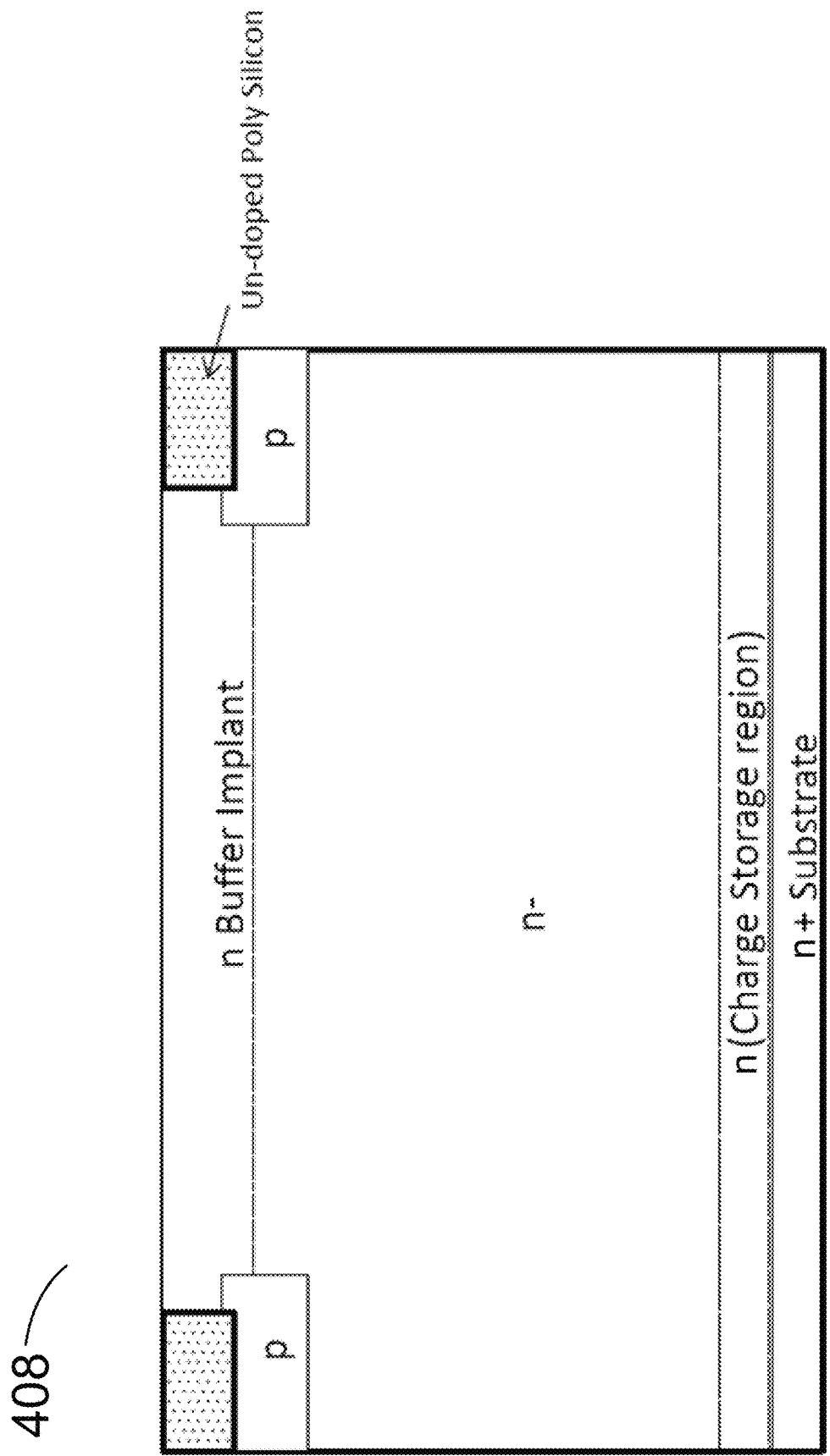
FIG. 4B2

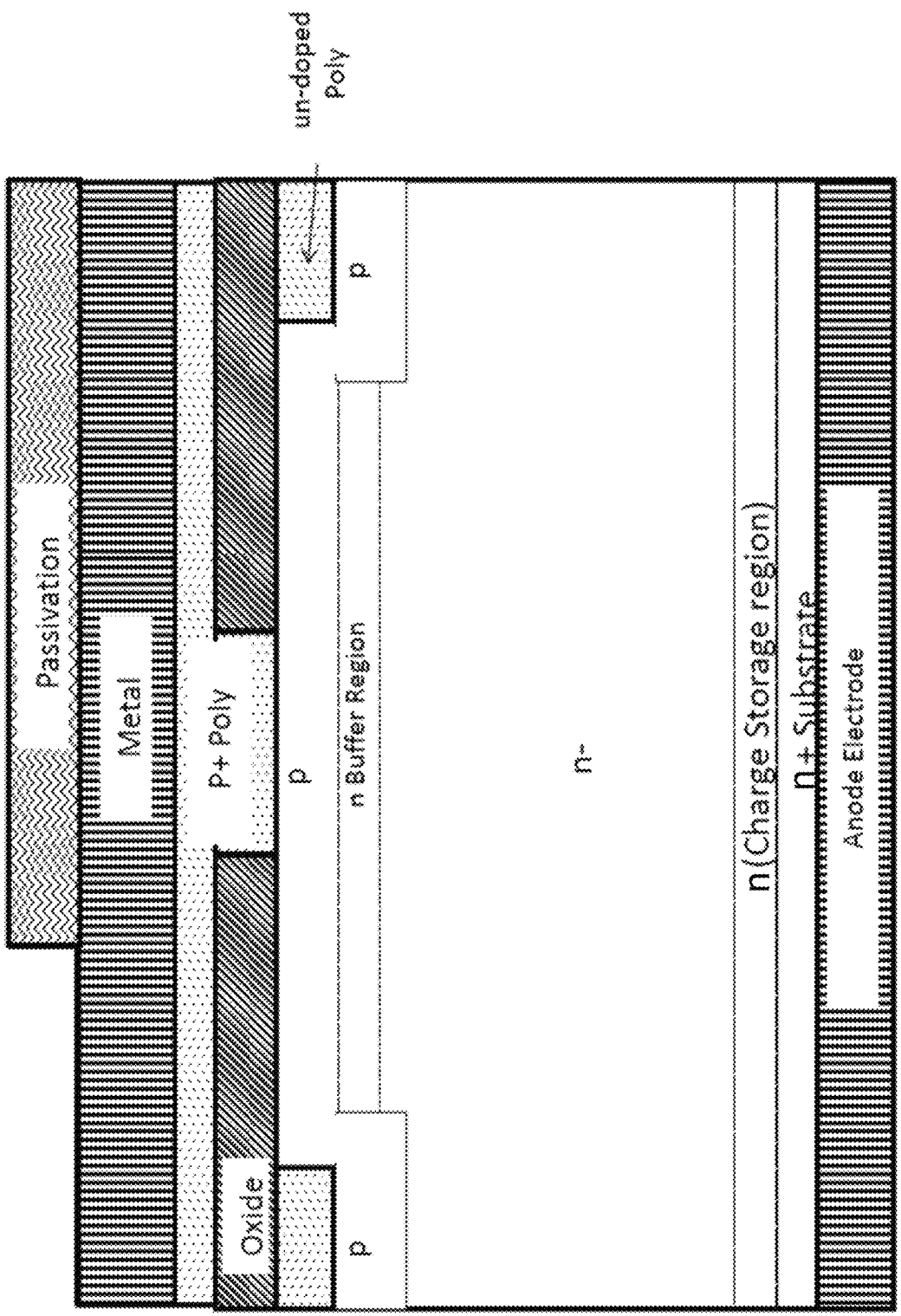
FIG. 4G1

4 Mask Process

Mask 801: Trench Mask/P Anode Implant

Mask 802: Contact Mask (BPSG Deposition and Contact Opening)

Mask 803: P+ Poly/Metal Mask

Mask 804: Pad Mask (Deposit SiO2/Si3N4 and Poly-imid and Pad opening)

FIG. 8A

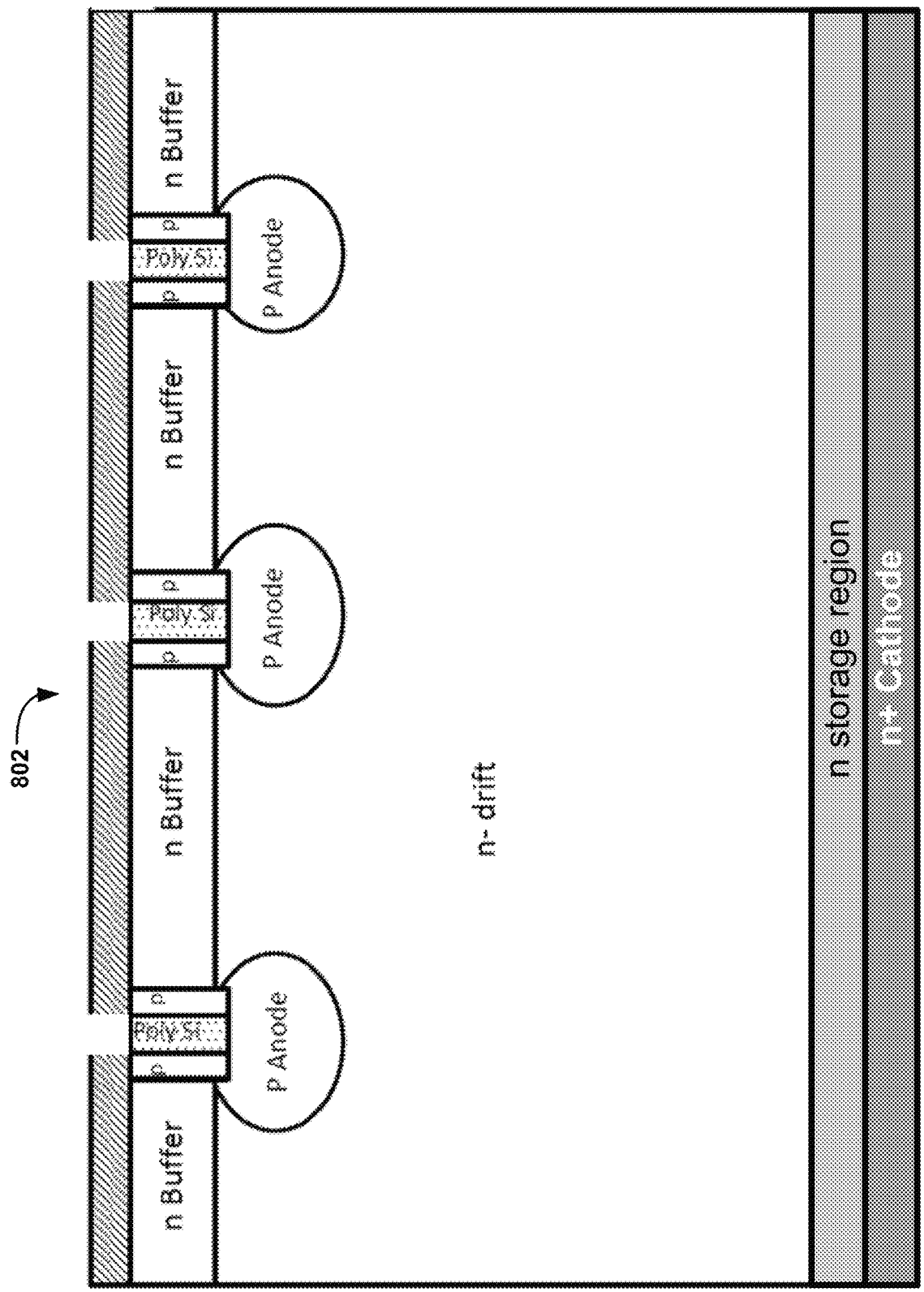
FIG. 8D1

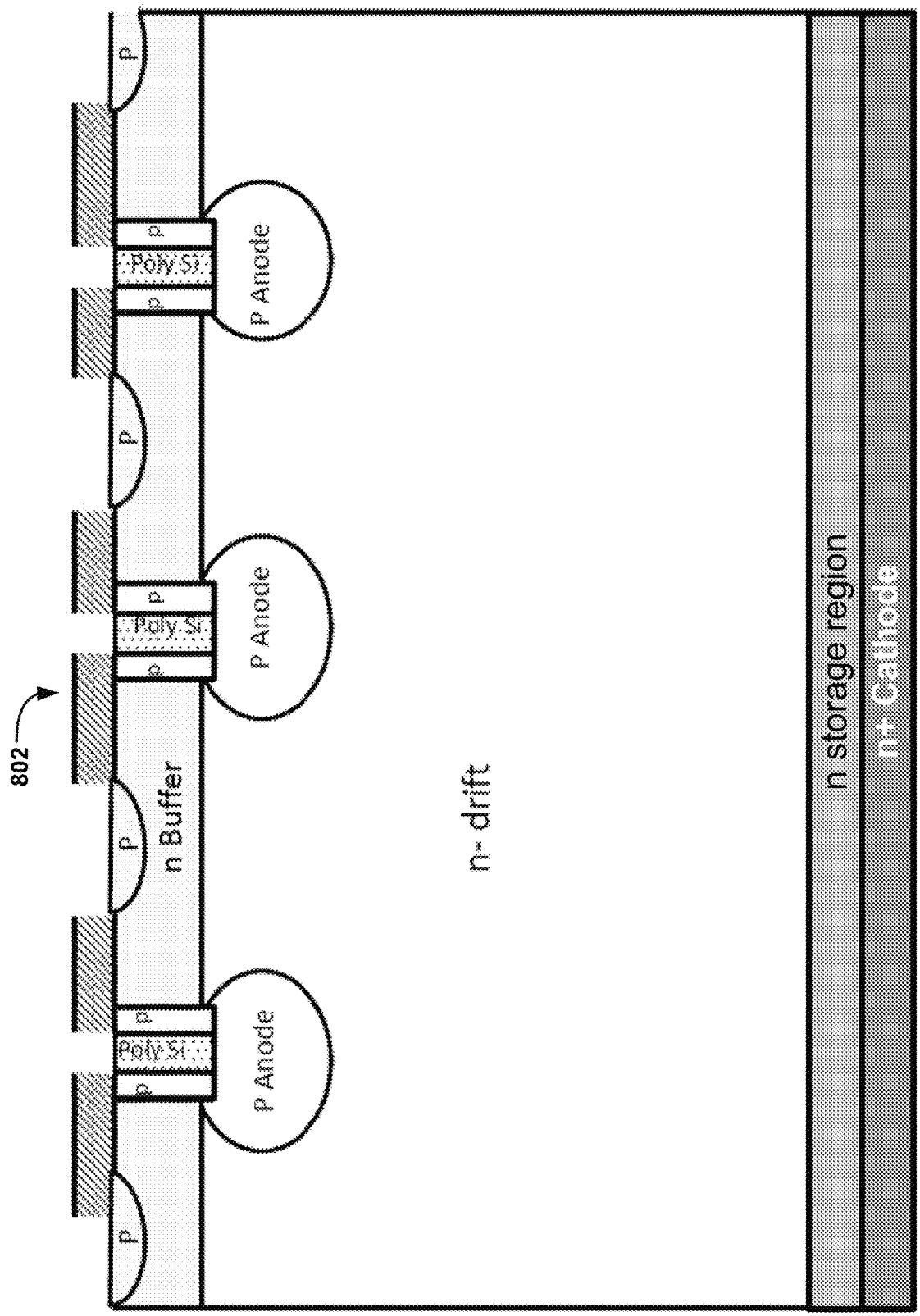
FIG. 8D2

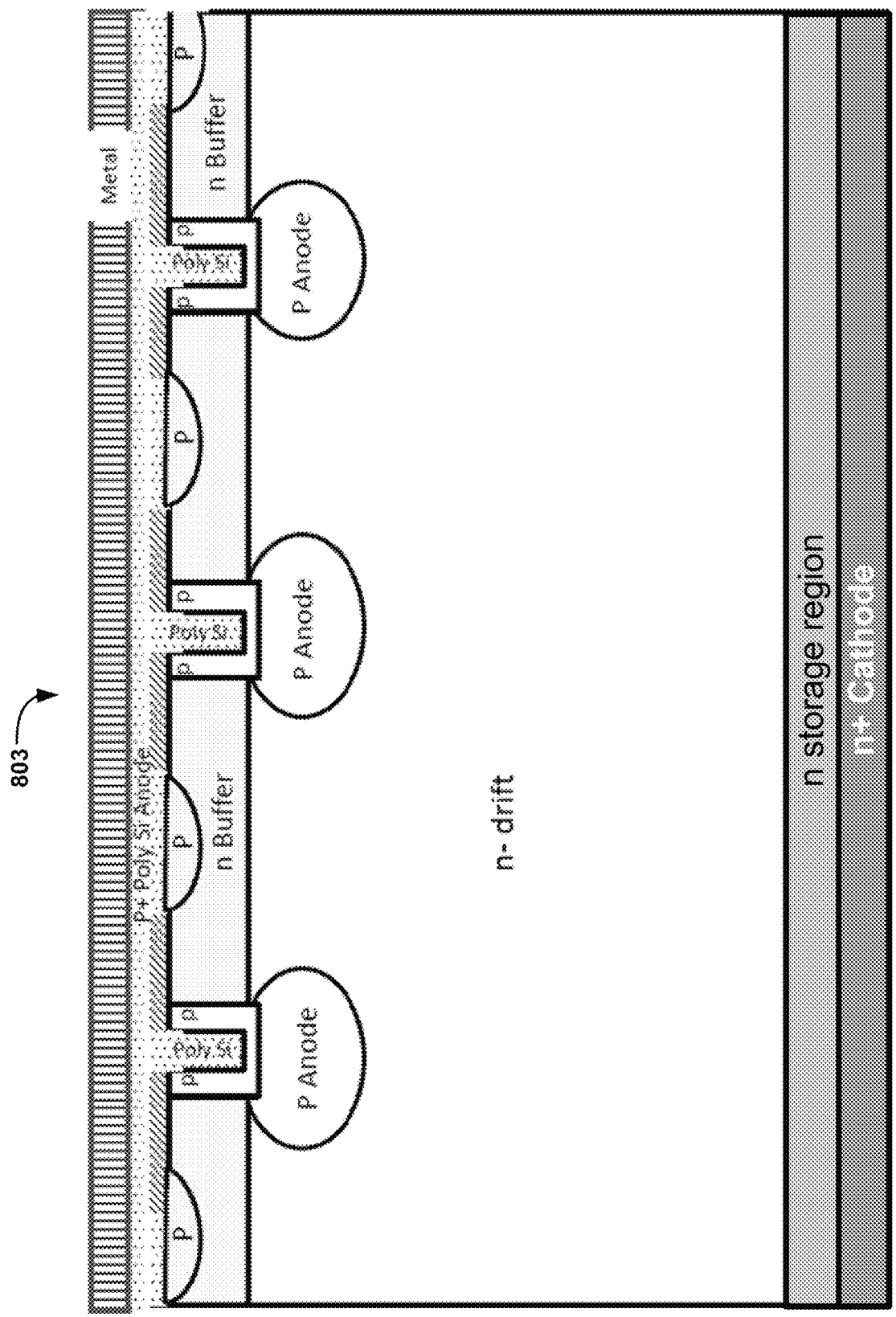
FIG. 8F1

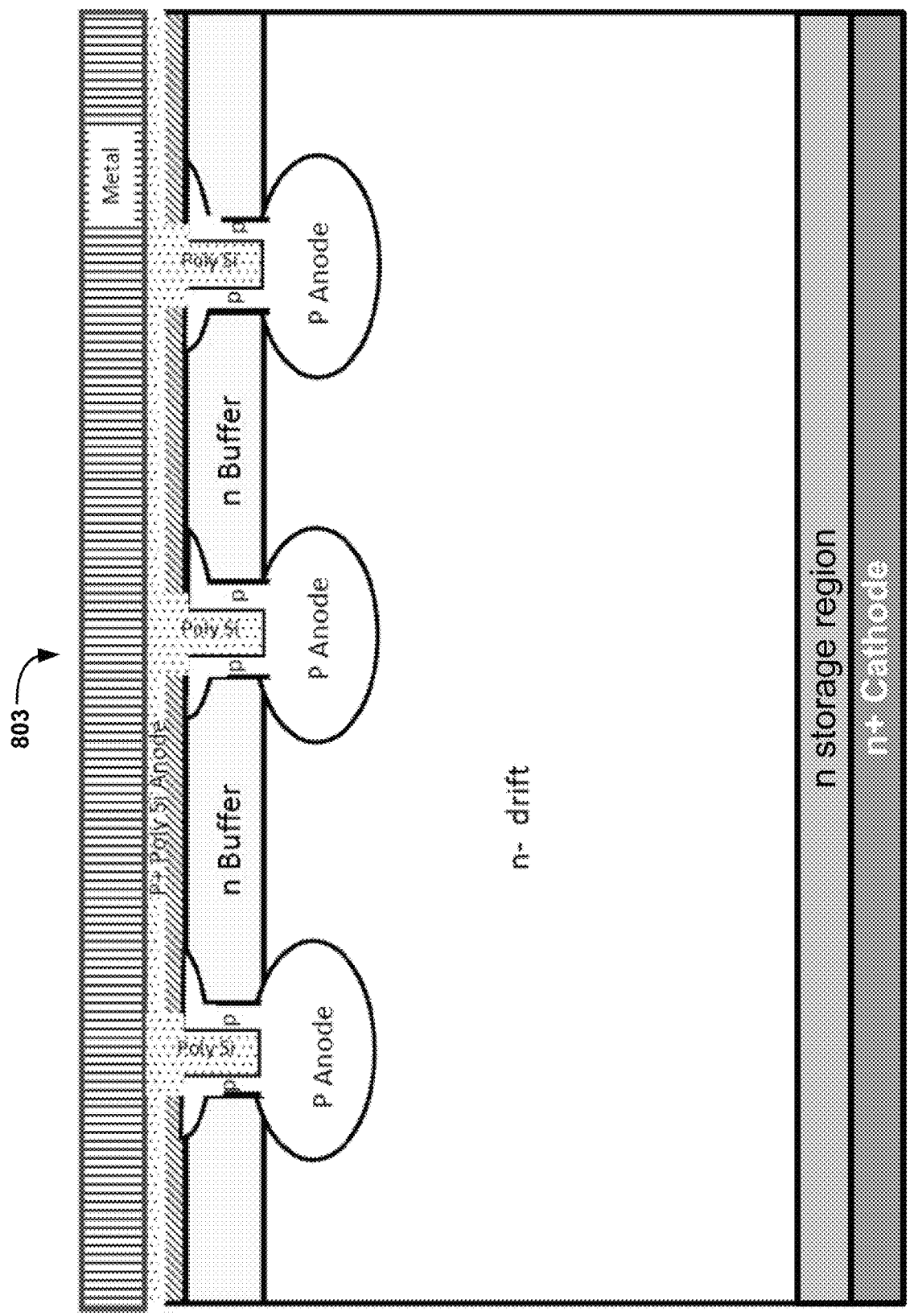
FIG. 8F2

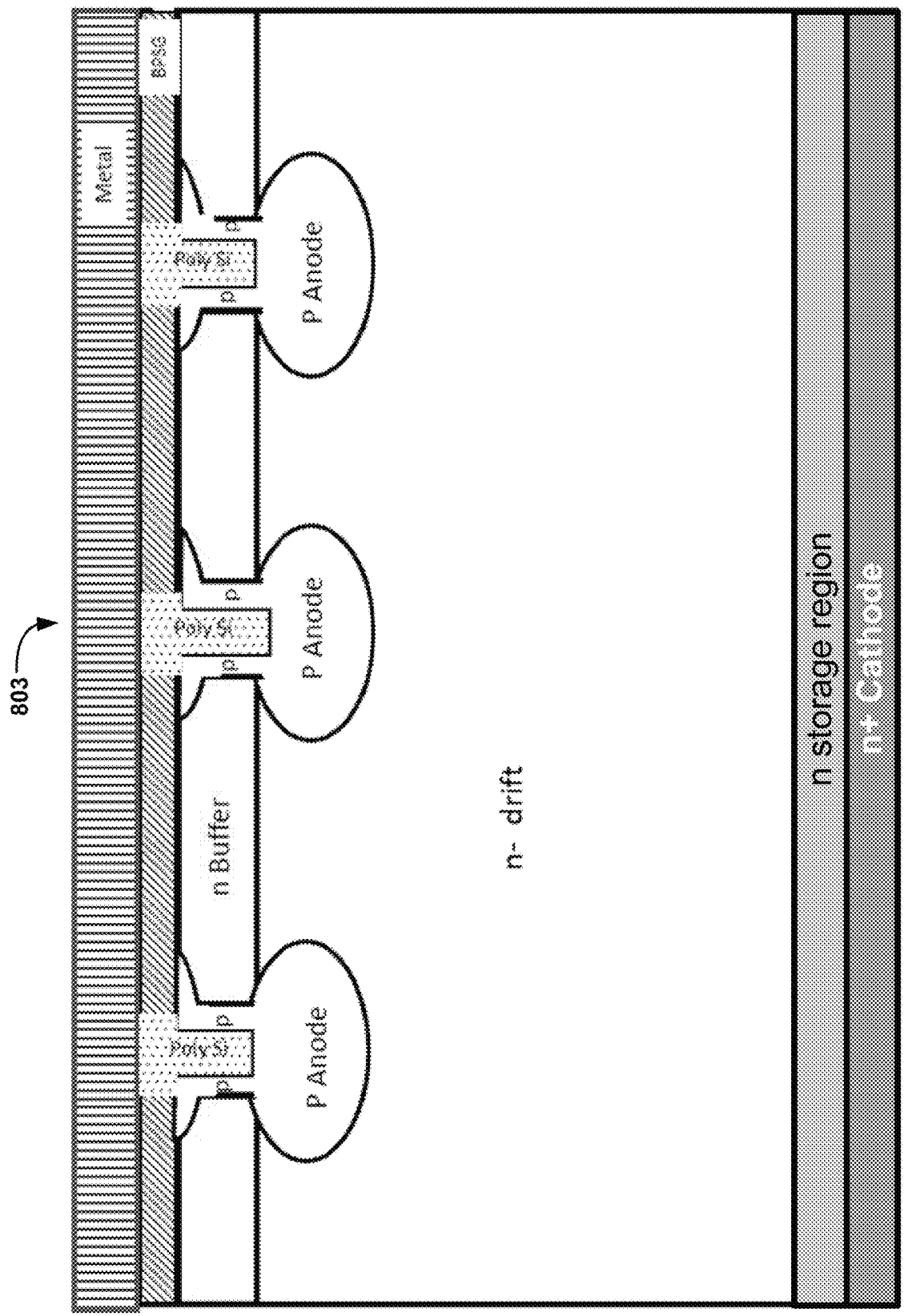
FIG. 8F3

5 Mask Process

Mask 1001: N Buffer Mask

Mask 1002: Trench Mask/P Anode Implant

Mask 1003: Contact Mask

Mask 1004: Metal Mask

Mask 1005: Pad Mask

FIG. 10A

CARRIER INJECTION CONTROL FAST RECOVERY DIODE STRUCTURES

CROSS-REFERENCE TO RELATED APPLICATION(S)

The present application claims the benefit of U.S. Provisional Application Ser. No. 62/739,820 filed Oct. 1, 2018.

FIELD

The present technology pertains in general to power semiconductor devices and more specifically, to fast recovery diode structures.

BACKGROUND

The approaches described in this section could be pursued, but are not necessarily approaches previously conceived or pursued. Therefore, unless otherwise indicated, it should not be assumed that any of the approaches described in this section qualify as prior art merely by virtue of their inclusion in this section.

Every Insulated Gate Bipolar Transistor (IGBT) requires a Fast Recovery Diode (FRD) across its collector and emitter terminals to handle current conduction during inductive switching type applications such as motor control. To minimize switching losses and lower circuit noise of an FRD, the FRD should have short reverse recovery time, low peak reverse recovery current, soft recovery current, and should also operate at between 150 to 175 Degree C. junction temperature. To lower reverse recovery peak current and shorten recovery time, minority carrier lifetime of the FRDs can be reduced by using gold, platinum or electron beam irradiation.

There are some drawbacks with minority carrier lifetime reduction including more voltage spikes and oscillations being generated during the FRD reverse recovery; leakage current increasing during the blocking stage, especially at higher temperatures such as 150 Degree C. and above; and forward voltage drop (Vf) also increasing as a result of minority carrier lifetime reduction.

SUMMARY

This summary is provided to introduce a selection of concepts in a simplified form that are further described in the Detailed Description below. This summary is not intended to identify key or essential features of the claimed subject matter, nor is it intended to be used as an aid in determining the scope of the claimed subject matter.

Various embodiments of FRD structures control charge injection by lowering carrier storage and also in some embodiments reducing minority carrier life time in the close vicinity of the Anode rather than reducing minority carrier lifetime in the n-region to avoid adverse effects of the lifetime reduction.

In some embodiments, a method is provided for fabricating a Charge Injection Controlled (CIC) Fast Recovery Diode (FRD), the method comprising forming a drift region of a first conductivity type on top of a heavily doped semiconductor substrate by epitaxial growth, the drift region supporting blocking of high voltage and comprising a buffer region on the top region of the drift region, a lightly doped middle region, and a medium level doped charge storage region; forming trenches, in the drift region, having depth ranging from 2-6 microns; ion implanting dopants of a second conductivity type into the trenches for forming a shield region of the second conductivity type, the shield region comprising a deep junction substantially spreading laterally beneath the buffer region of the first conductivity type; filling the trenches with poly silicon having lightly doped second conductivity type impurities encircling the buffer region of the first conductivity type; after planarizing the poly silicon in the trenches, ion implanting dopants of the second conductivity type to define a lightly doped anode; depositing Boron-doped Phospho Silicate Glass layer (BPSG) or Phospho Silicate Glass layer (PSG) for defining a contact; depositing poly silicon and ion implanting with the second conductivity type dopants with varying doping level for, at least in part, controlling carrier injection.

BRIEF DESCRIPTION OF THE DRAWINGS

Embodiments are illustrated by way of example, and not by limitation, in the figures of the accompanying drawings, in which like references indicate similar elements and in which:

FIG. 8A-FIG. 8H illustrates various steps of a 4 mask process for an FRD with poly filled trench to control minority carrier lifetime, according to various embodiments.

FIG. 10A-FIG. 10F shows example steps of a five mask process, according to some embodiments.

DETAILED DESCRIPTION

Figure 1:
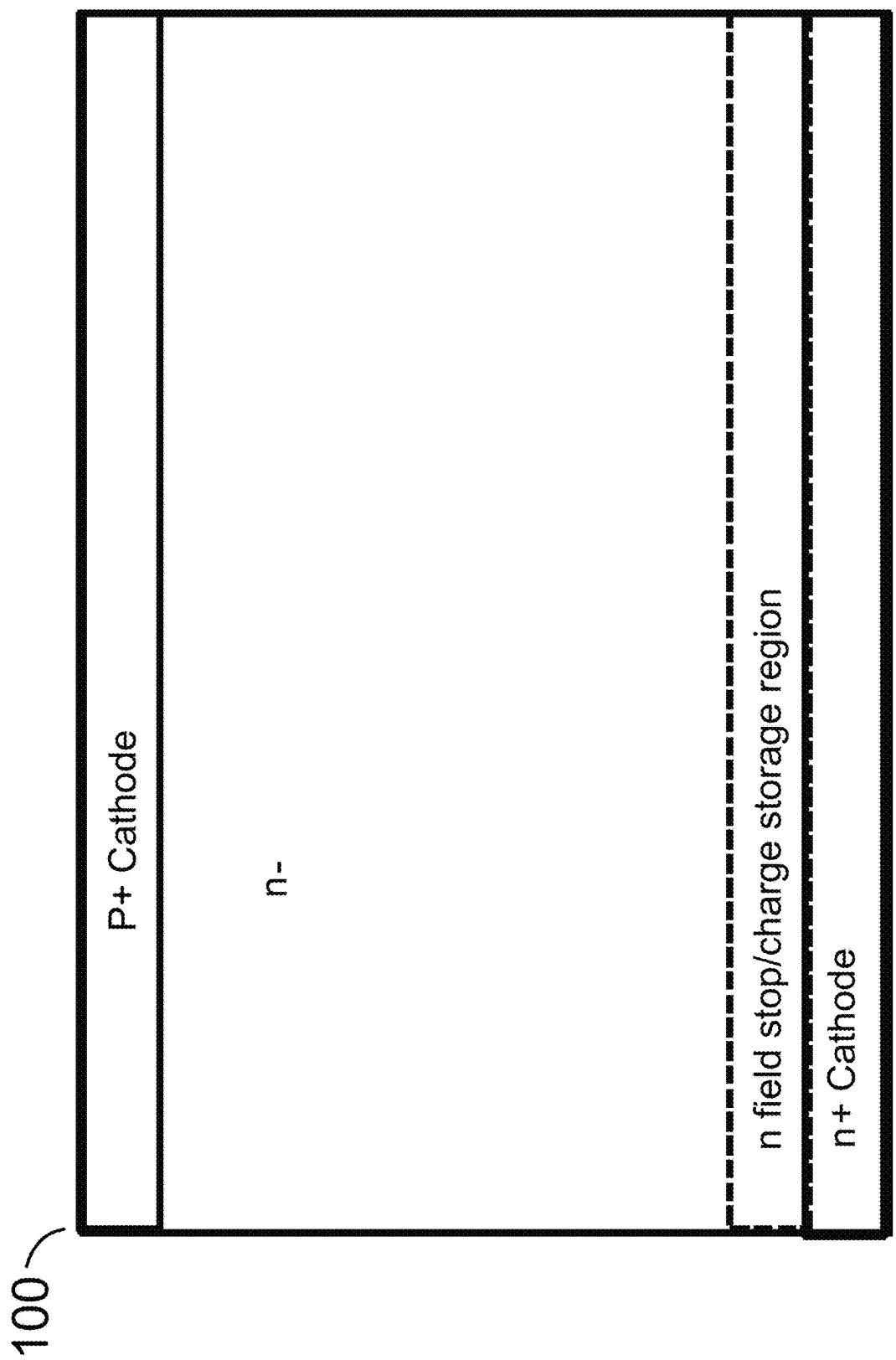
FIG. 1 illustrates an example prior art FRD structure.

While this technology is susceptible of embodiment in many different forms, there is shown in the drawings and will herein be described in detail several specific embodiments with the understanding that the present disclosure is to be considered as an exemplification of the principles of the technology and is not intended to limit the technology to the embodiments illustrated. The terminology used herein is for the purpose of describing particular embodiments only and is not intended to be limiting of the technology. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof. It will be understood that like or analogous elements and/or components, referred to herein, may be identified throughout the drawings with like reference characters. It will be further understood that several of the figures are merely schematic representations of the present technology. As such, some of the components may have been distorted from their actual scale for pictorial clarity.

The present disclosure is related to various embodiments of systems and methods for providing Fast Recovery Diode structures to control the charge injection by lowering the carrier storage rather than reducing the minority carrier lifetime to avoid adverse effects of the lifetime reduction with the exception of local minority carrier life time reduction in the close vicinity of the Anode in some embodiments.

FIG. 1 illustrates an example prior art FRD structure 100. In this example, the structure 100 includes an n+ cathode, an n type field stop or carrier storage region, a lightly doped or intrinsic region to support blocking of high voltage, and a P+ for an anode region. Electron irradiation kills carrier lifetime uniformly across the FRD, which increases Vf significantly while speeding up reverse recovery of the FRD. To improve FRD performance, localized lifetime killing techniques were also developed such as Au, Pt diffusion, neutron, He+ and Proton implant type techniques.

Figure 2A:
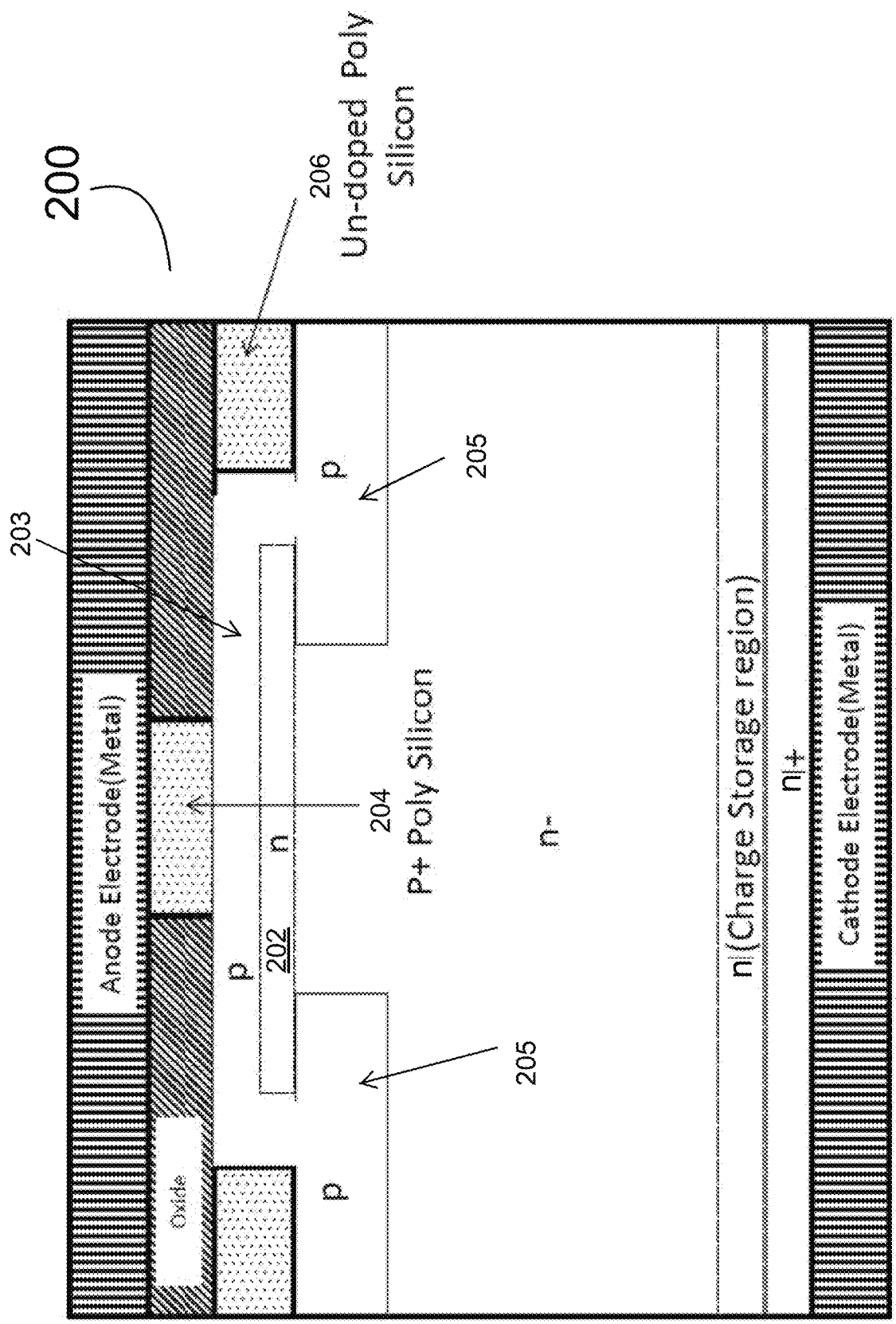
FIG. 2A, FIG. 2B, illustrate various embodiments of an example FRD structure of the present technology.
Figure 2B:
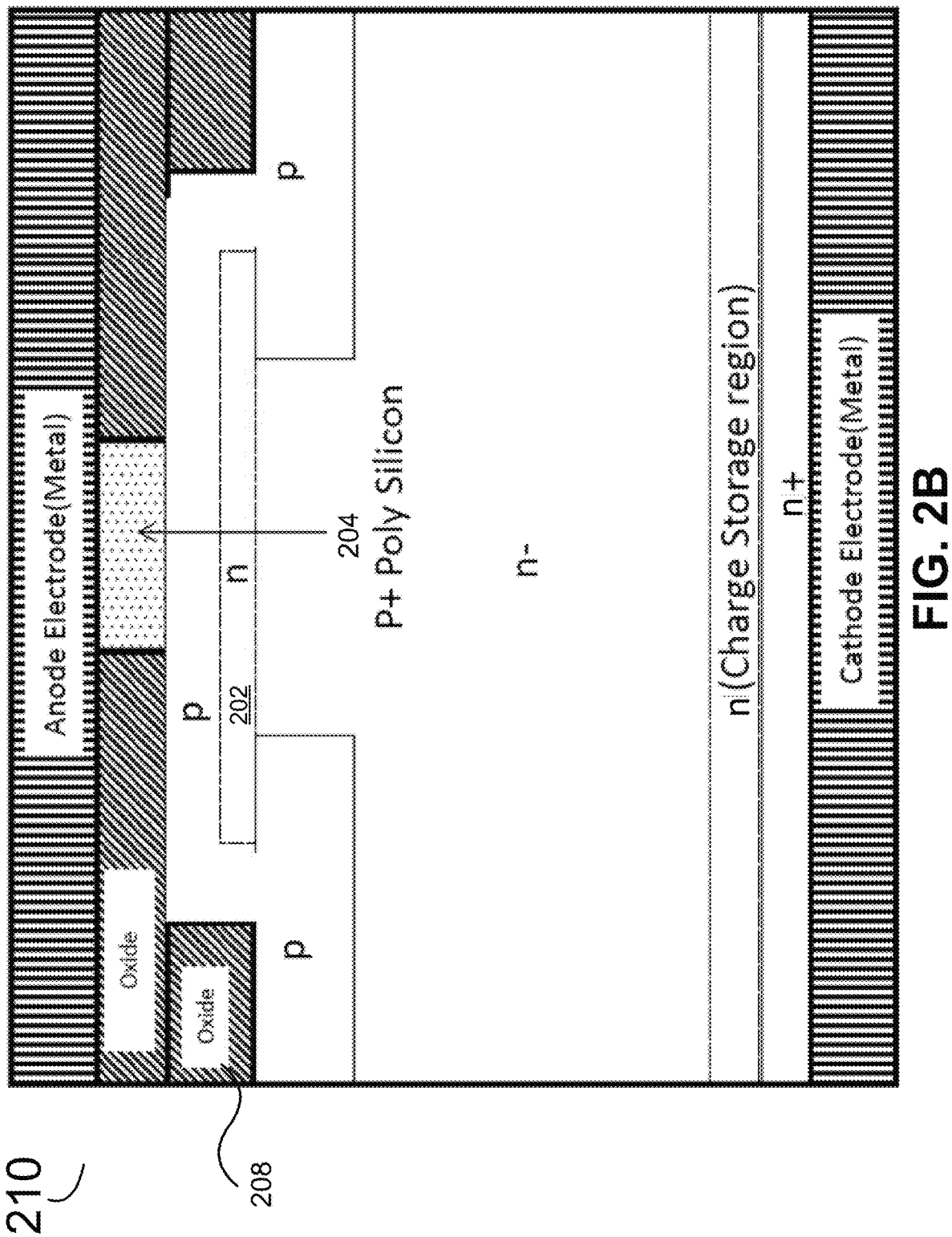
Figure 3:
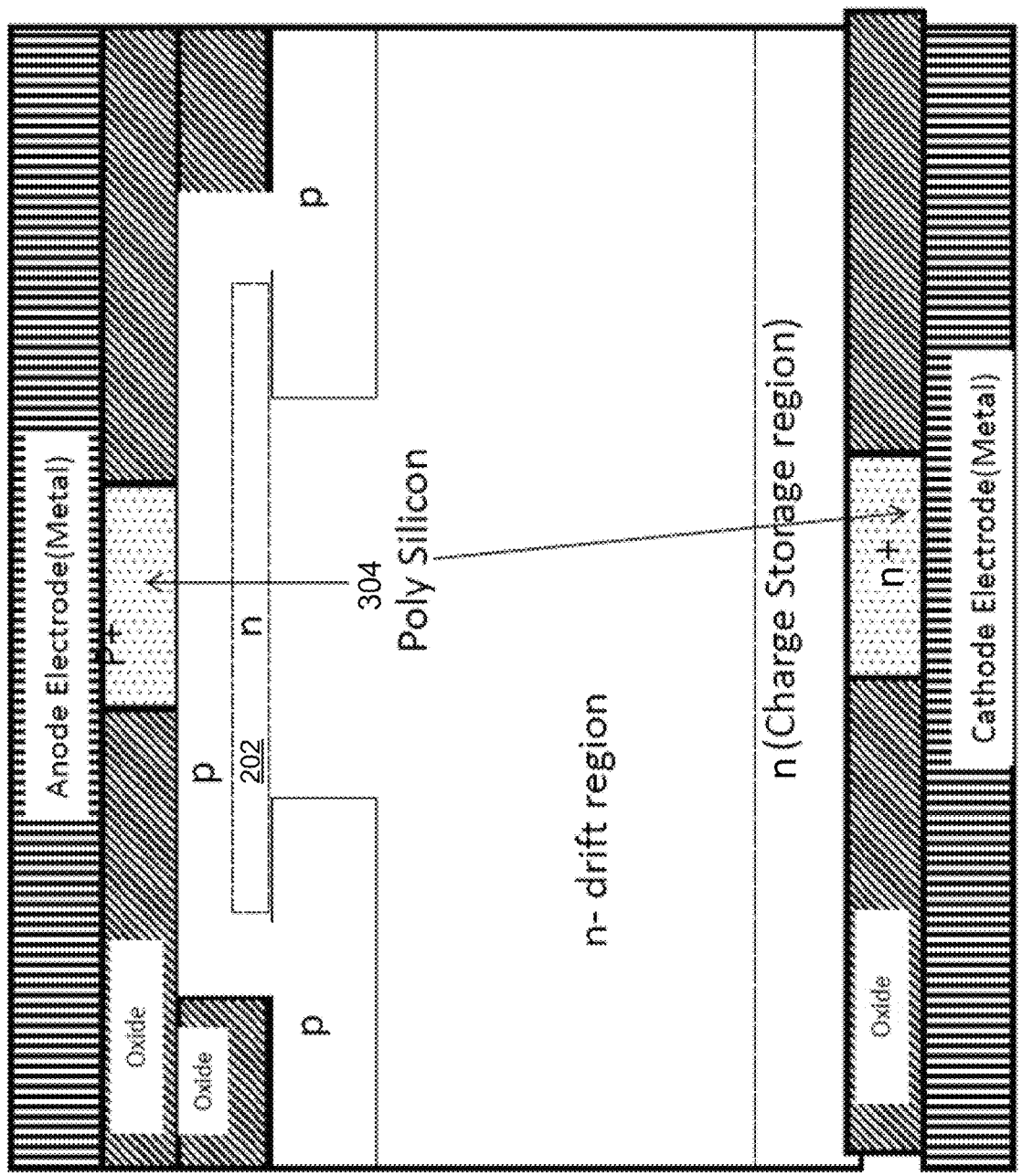
FIG. 3 shows an example FRD structure embodiment which can enable charge injection control from both cathode and anode regions.

FIG. 2A, FIG. 2B, and FIG. 3 illustrate various embodiments of example Charge Injection Control (CIC) FRD structures of the present technology. More specifically, FIG. 2A shows an example poly filled trench type FRD structure 200. FIG. 2B illustrates more specifically an oxide filled trench type FRD structure 210. FIG. 3 shows another example oxide filled trench type FRD structure identified as 300. The FRD structures 200, 210, and 300 can each include a doped n buffer region 202 having from 1e17Cm-3 to 2e14 Cm-3 concentration range at the anode side, a P type shallow junction anode region 203 (rather than P+) on the anode side, and use a P+ type Doped Poly Silicon (204 in FIGS. 2A and 2B, 304 in FIG. 3) as an anode from 5e19 Cm-3 to 5e17 Cm-3 doping concentration range. In various embodiments, to prevent low breakdown voltage due to heavy n doping at the P-N junction, the FRD structures include deep P junctions 205 as shield regions with doping concentration ranging from 1e18Cm-3 to 1E15 Cm-3, surrounding the n-Buffer regions to deplete n buffer charge laterally as well as vertically to lower electric field and prevent premature breakdown of the FRD.

For the FRDs with anode Charge Injection Control (CIC) structures 200 and 210 in FIG. 2A and FIG. 2B respectively, injection of the hole concentration can be adjusted by the doping concentration of n-buffer and P junction, as well as doping concentration of the anode. FIG. 2A shows the example P poly anode CIC FRD including P poly filled trenches, with one identified at 206. FIG. 2B shows the example P poly anode CIC FRD with oxide filled trenches, with one identified at 208.

FIG. 3 shows an example FRD structure embodiment which can enable charge injection control from both cathode and anode regions; using P or P+ poly silicon for the anode to control hole injection levels and n+ poly silicon or sputtered n+ silicon with doping concentration ranging from 5e18 Cm-3 to 1e20 Cm-3 for the cathode to control electron injection levels for faster diode reverse recovery time and peak current without using minority carrier life shorting. FIG. 3 shows an example embodiment with poly silicon or sputtered n+ silicon cathode and anode CIC FRD with P poly filled trenches; however, trenches can be filled with oxide.

Figure 4A:
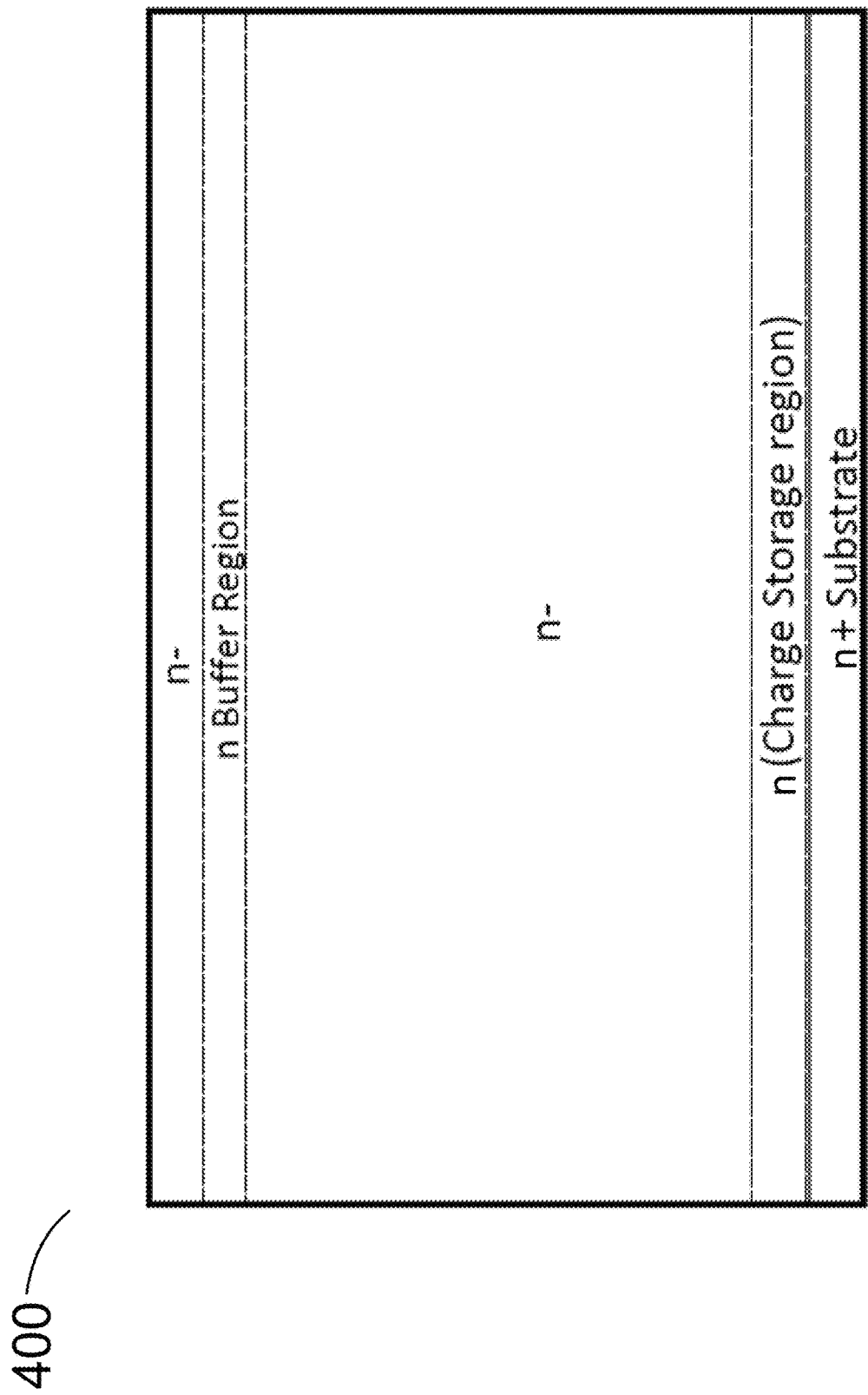
FIG. 4A-FIG. 4I show aspects of example process flows for producing various embodiments of the CIC FRD structures.

FIG. 4A illustrates that, for an example poly cathode CIC FRD, the process includes, identified at 400, starting a wafer with n-nn-n epitaxial (epi) on an n+ Substrate.

FIG. 4A1 illustrates that, for an example poly anode CIC FRD, the process includes, identified at 402, starting a wafer with n-n-n epi on an n+ Substrate.

Figure 4B:
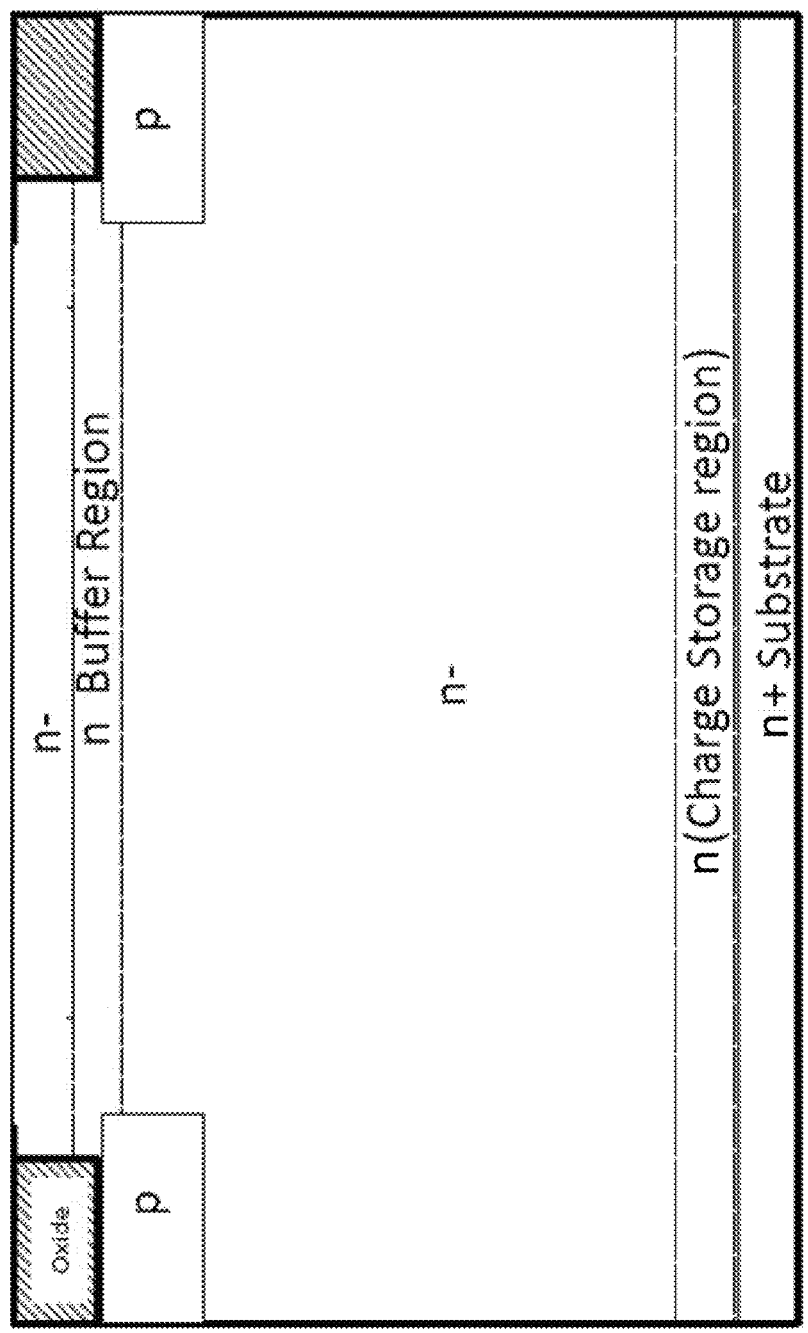

FIG. 4B illustrates, according to various embodiments, aspects of the process flow for an example mask, the process flow including, identified at 404, trenching etch for deep P junctions with n-nn-n wafer; etching a 2-3 microns deep and 0.5 to 1 microns wide trench; including a high energy boron ion implant and drive; and depositing oxide and chemical mechanical planarization (CMP) oxide to planarize the wafer surface.

FIG. 4B1 illustrates, according to various embodiments, aspects of the process flow for the example mask, the process flow including, identified at 406, trenching etch for deep P junctions with an nn-n type wafer; etching a 2-3 microns deep and 0.5 to 1 microns wide trench; including a high energy boron ion implant and drive; depositing oxide and CMP oxide to planarize the wafer surface; and having a high energy phosphor ion implant and drive in without a mask.

FIG. 4B2 illustrates, according to various embodiments, aspects of the process flow for an example mask, the process flow including, identified at 408, trenching etch for deep P junctions; etching a 2-3 microns deep and 0.5 to 1 microns wide trench; including a high energy boron ion implant and drive; depositing un-doped poly silicon and etch or CMP poly silicon to planarize the wafer surface; and having a high energy phosphor ion implant and drive in without a mask.

Figure 4C:
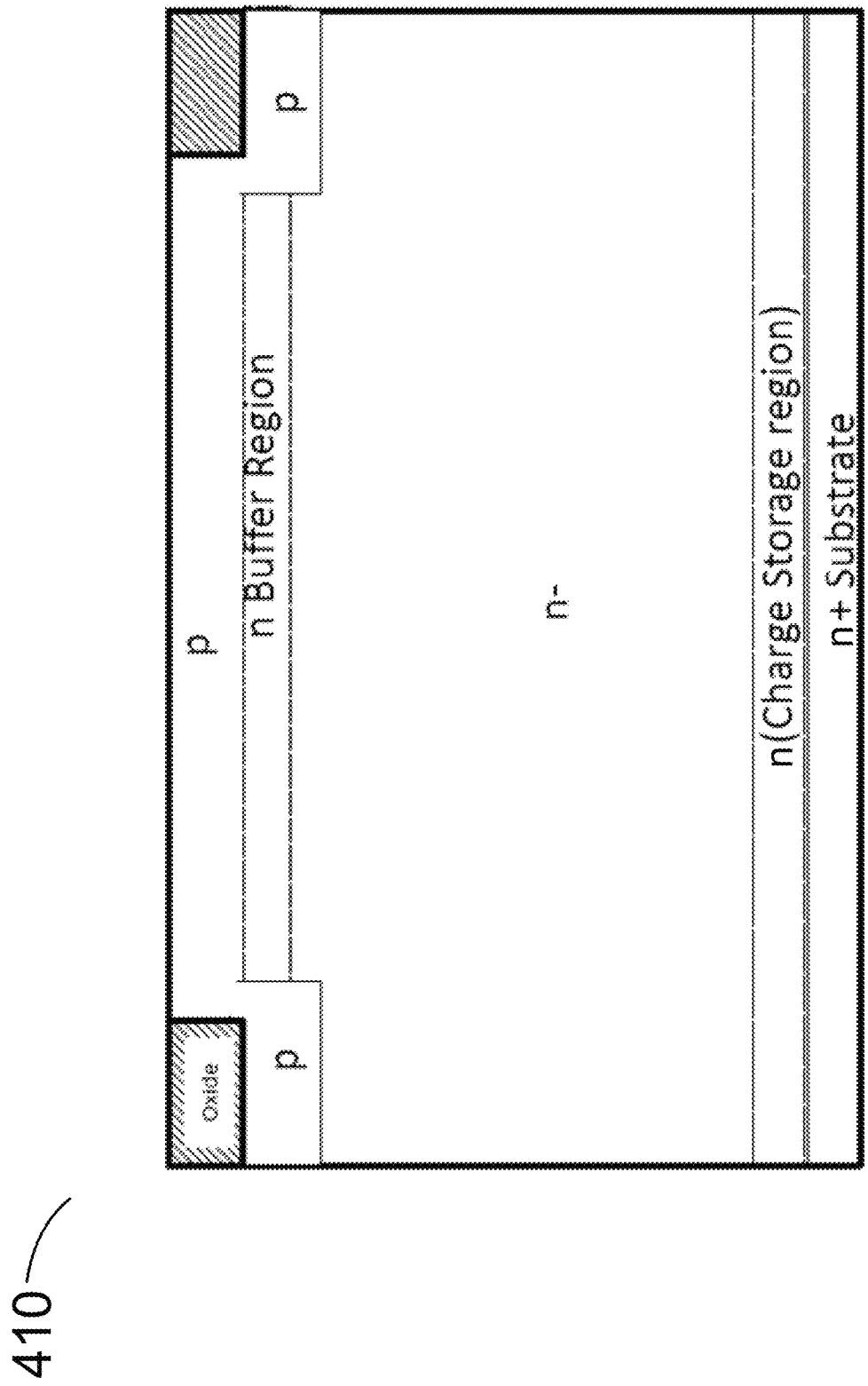

FIG. 4C illustrates, according to various embodiments, aspects of the process flow for an example P anode implant mask, the process flow including, identified at 410, blocking boron ion implantation from the termination region; and having a high energy boron ion implant and drive.

Figure 4D:
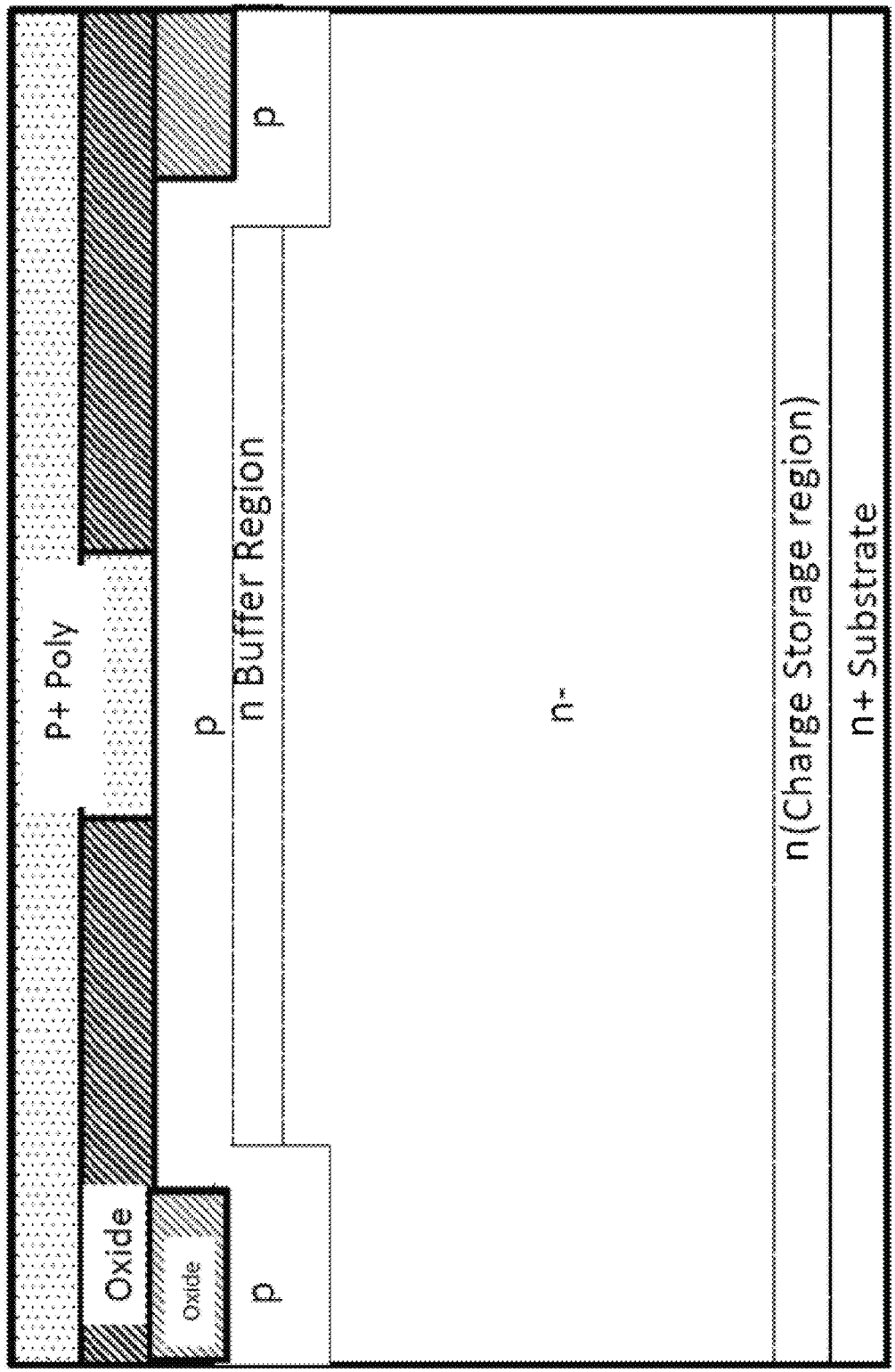

FIG. 4D illustrates, according to various embodiments, aspects of the process flow for an example contact mask, the process flow including, identified at 412, depositing Boron-doped Phospho Silicate Glass layer (BPSG) or Phospho Silicate Glass layer (PSG); using the mask open cathode contact windows; depositing poly silicon and dope with boron (e.g., ion implant dose range from 1e13 cm-2 to 5e15 Cm-2); and activating the boron in poly silicon.

Figure 4E:
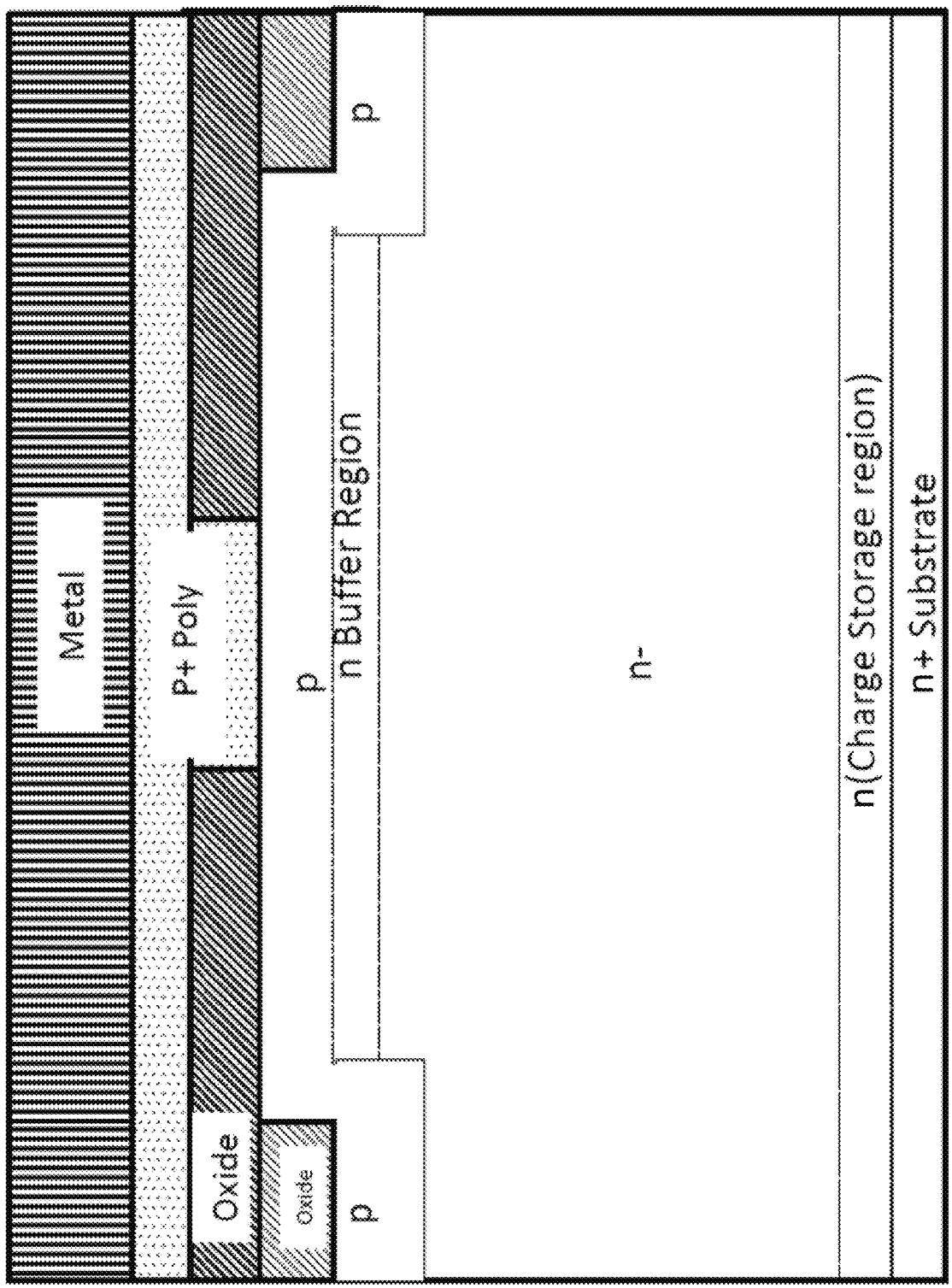

FIG. 4E illustrates, according to various embodiments, aspects of the process flow for an example metal mask including, identified at 414, depositing an Aluminum:Silicon:Copper (Al:SI:Cu) alloy with or without Titanium/Titanium Nitride (Ti/TiN) buffer metal; and using this mask, etching off metal and then poly silicon.

Figure 4F:
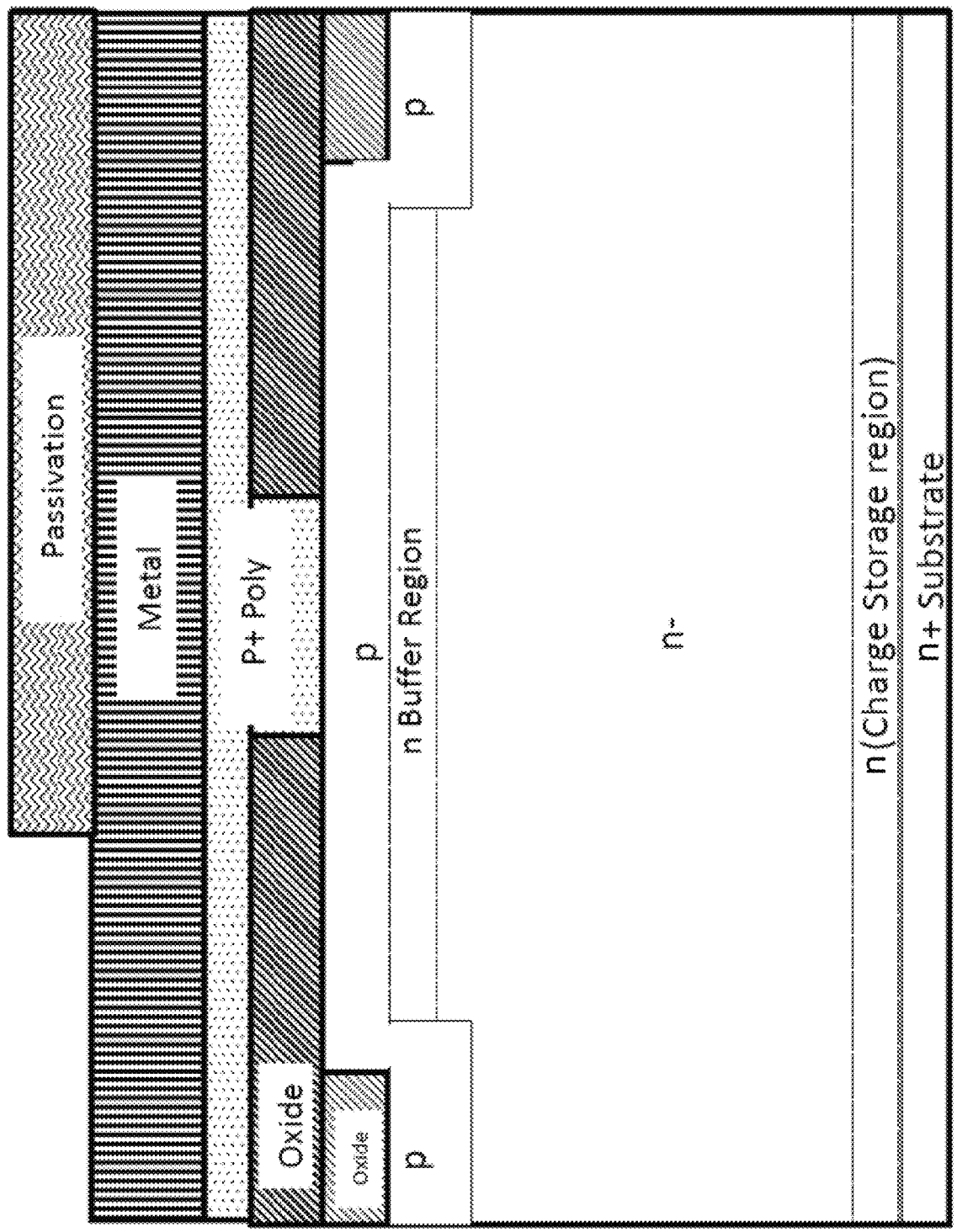

FIG. 4F illustrates, according to various embodiments, the process flow for an example pad mask including, identified at 416, depositing a passivation layer with or without poly imide; using the mask etch off passivation layers including poly imide from the bonding pad and saw streets.

Figure 4G:
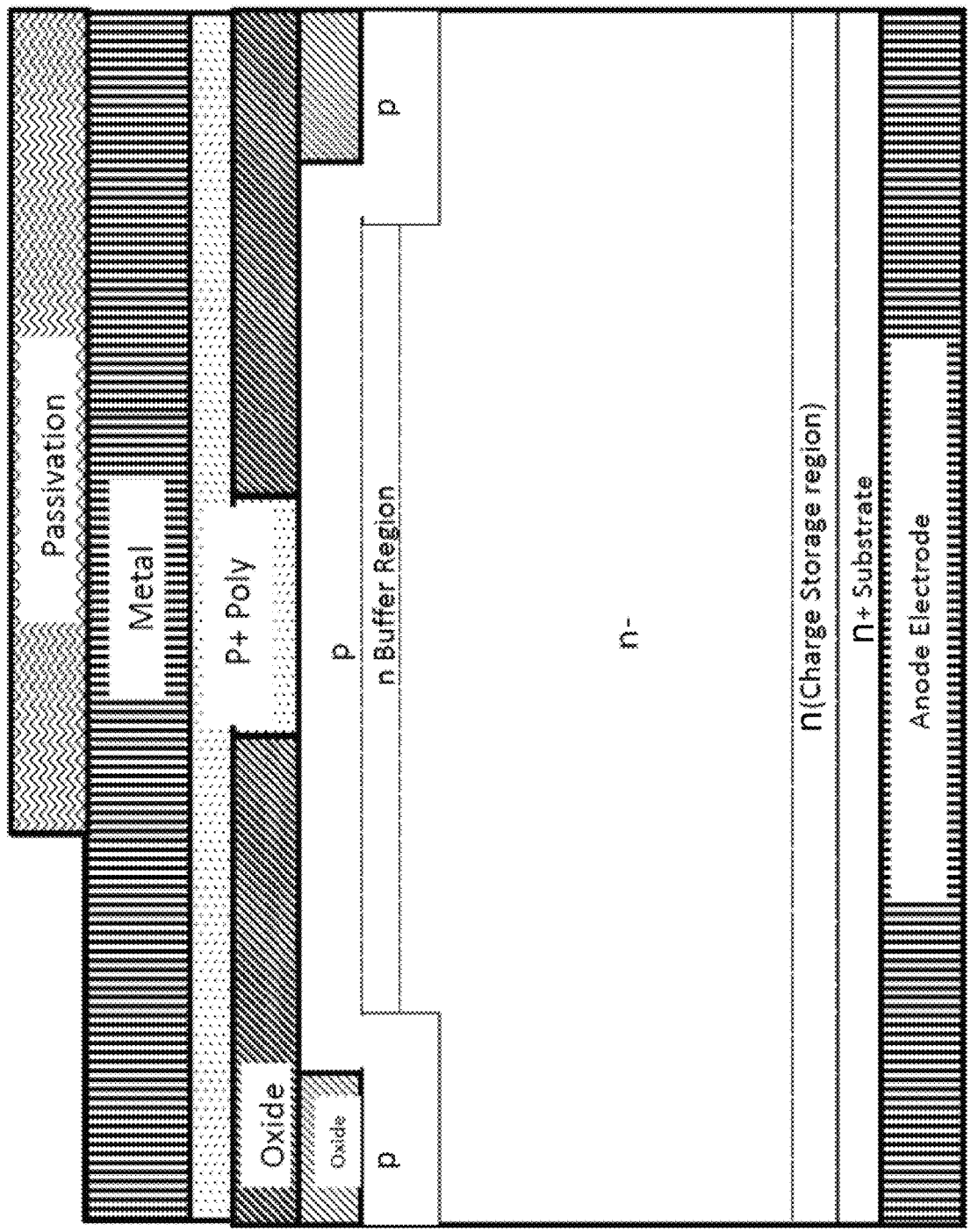

FIG. 4G illustrates, according to various embodiments, aspects of the process including, identified at 418, for anode electrode formation for a poly cathode CIC FRD, after pad mask, grinding the wafers, if n+ substrate and deposit backside metal Titanuim:Nickel:Silver (Ti:Ni:Ag) alloy or Gold (Au) to form the anode electrode. In various embodiments, sintering is performed for completing fabrication of the wafer. As is well known in the art, the sintering can include alloying, for example, a 400 Degree C. metal alloying step inside a diffusion tube in the Nitrogen environment to avoid metal surface oxidation.

FIG. 4G1 illustrates, according to various embodiments, aspects of the process including, identified at 420, for cathode electrode formation for a poly anode CIC FRD, after pad mask, grinding the wafers, if n+ substrate and deposit backside metal Ti/Ni/Ag or Gold to form a cathode electrode; and having final structures with un-doped poly silicon filling the trenches.

Figure 4H:

FIG. 4H illustrates, according to various embodiments, aspects of the process including, identified at 422, for anode electrode formation for a poly anode and cathode CIC FRD, after wafer thinning and backside etching; depositing oxide and etching off oxide from the backside for an anode contact; depositing n-F in-situ doped poly Si and deposit backside metal Ti/Ni/Ag or gold to form the anode electrode.

Figure 4I:
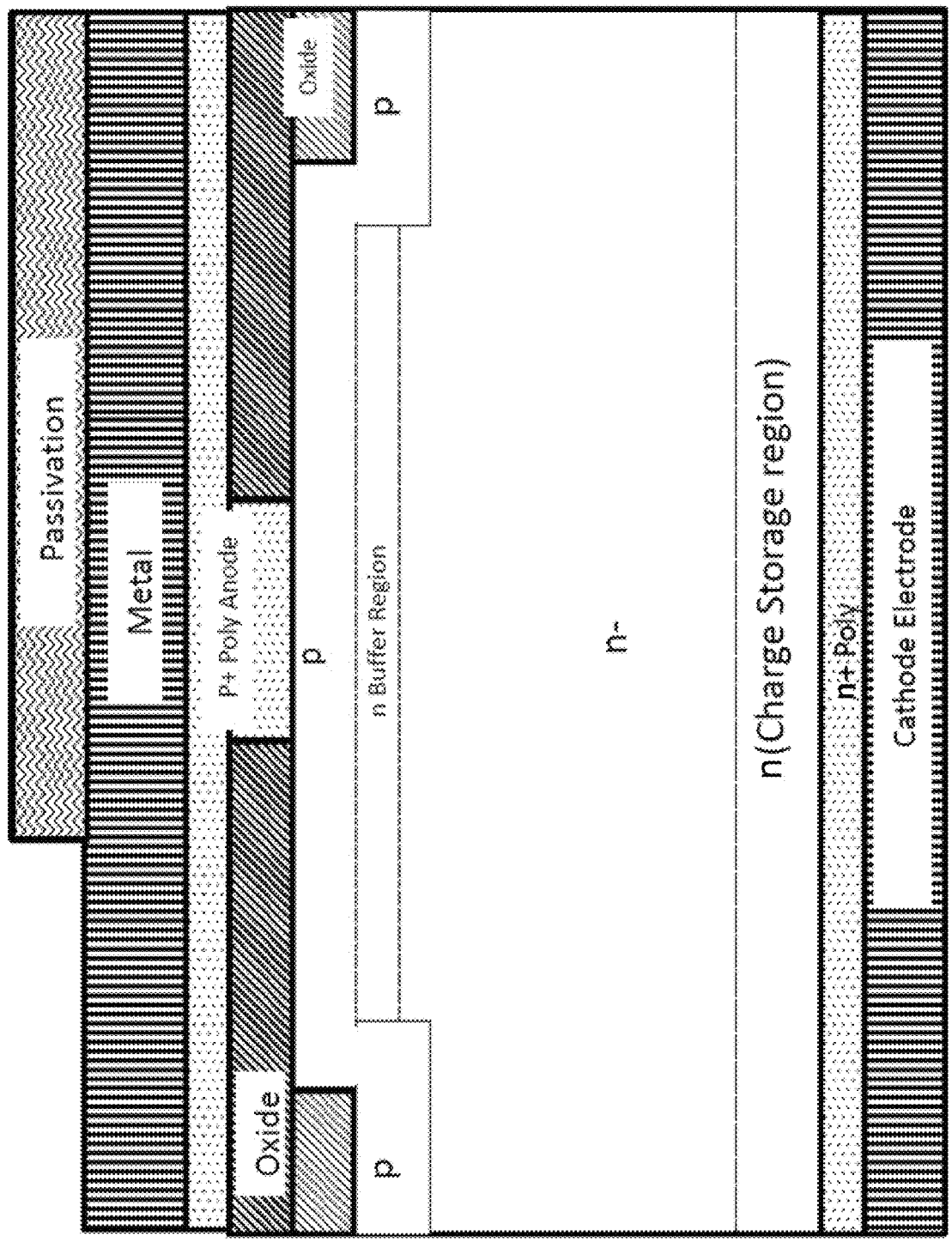

FIG. 4I illustrates, according to various embodiments, aspects of the process including, identified at 424, for cathode electrode formation for a poly anode and cathode CIC FRD, after wafer thinning and backside etching; depositing n+ in-situ doped poly Si and deposit backside metal Ti/Ni/Ag or Au (gold) to form a cathode electrode.

Figure 5A:
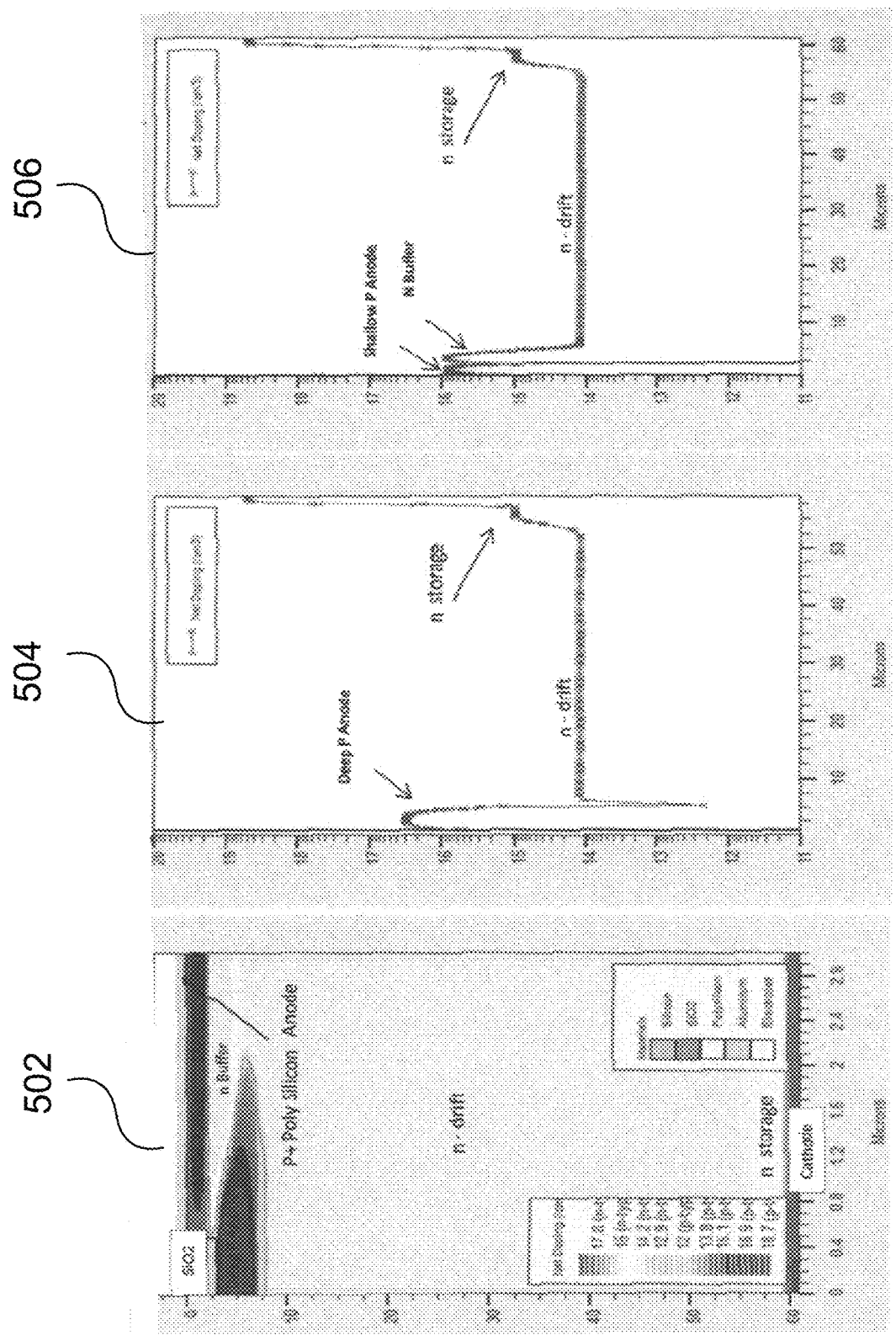
FIG. 5A illustrates 650V CIC FRD cross sections for 2D numerical simulations with 3 micron half pitch, according to some embodiments.

FIG. 5A illustrates 650V CIC FRD cross sections 502, 504, and 506 for 2D numerical simulations with 3 micron half pitch, according to some embodiments.

Figure 5C:
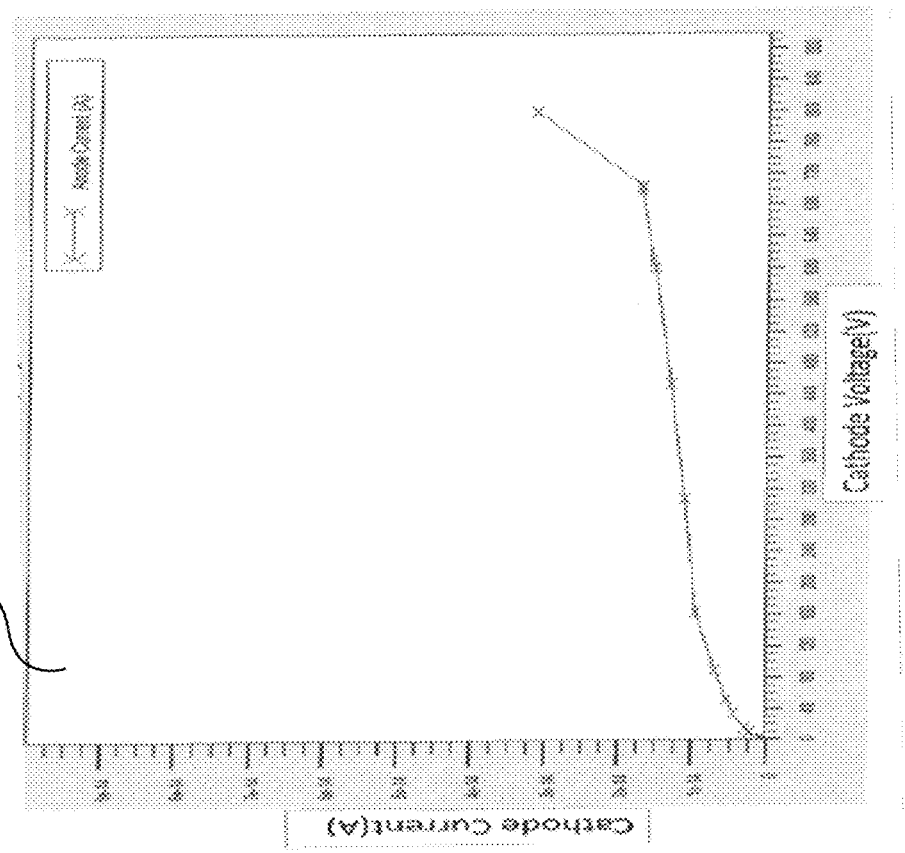
FIG. 5C illustrates a graph for example 2D simulated breakdown characteristics of the FRD structure in FIG. 5A.
Figure 5B:
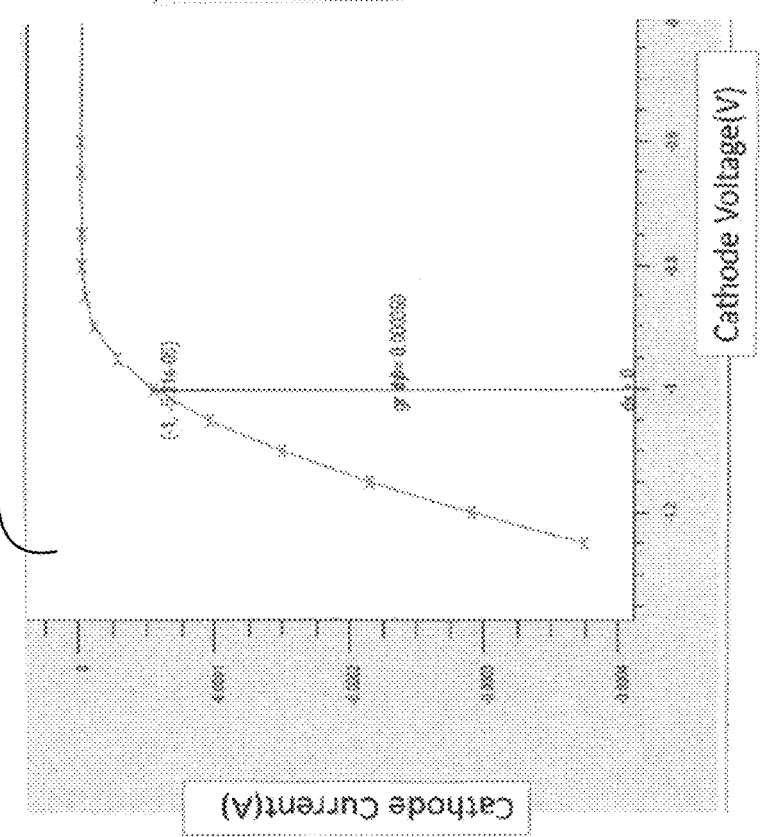
FIG. 5B illustrates a graph for example 2D simulated forward current and voltage characteristics of the structure in the example in FIG. 5A.

FIG. 5B illustrates graph 508 for example 2D simulated forward current and voltage characteristics of the structure in the example in FIG. 5A.

FIG. 5C illustrates graph 510 for example 2D simulated breakdown characteristics of the FRD structure in FIG. 5A.

Figure 5D:
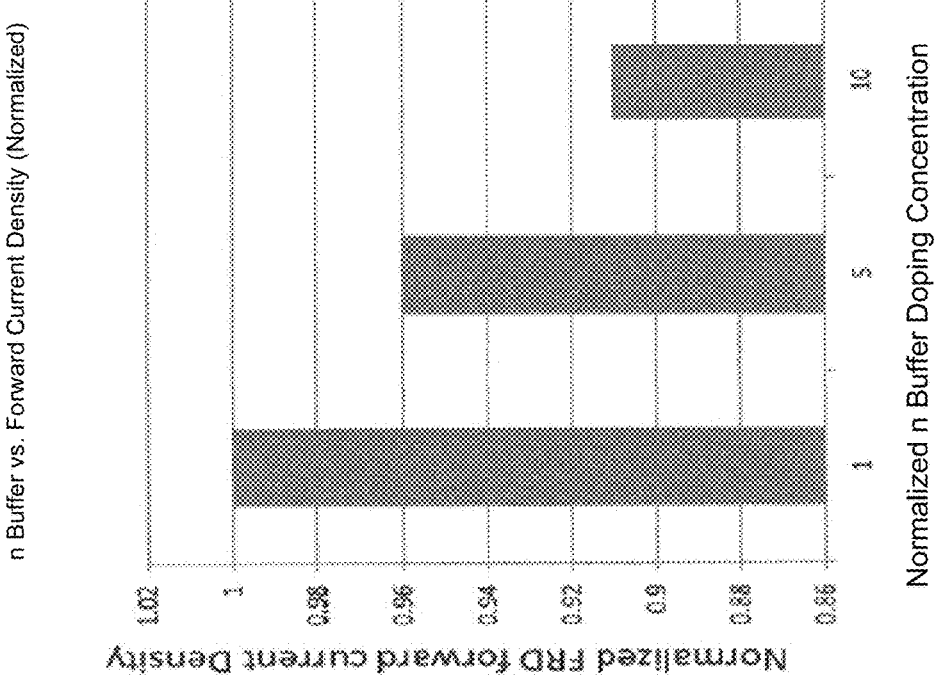
FIG. 5D illustrates graphs for example 2D simulated normalized FRD forward concentrations for an example FRD structure in FIG. 5A as function of P+ poly Si anode and n buffer.
Figure 5D:
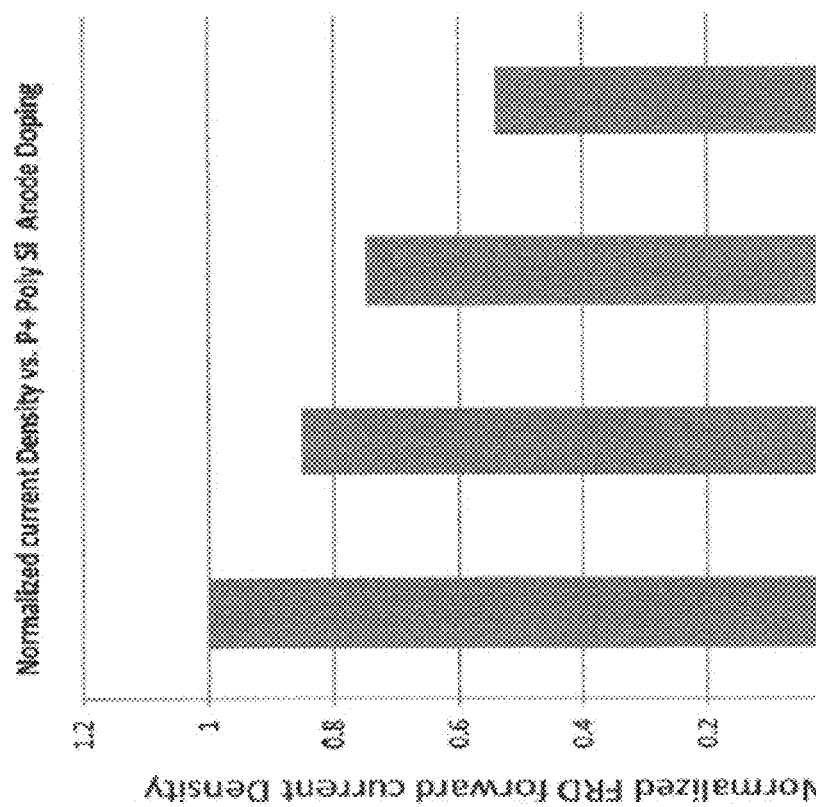

FIG. 5D illustrates graphs 514 and 516 for example 2D simulated normalized FRD forward concentrations for an example FRD Structure in FIG. 5A as function of P+ poly Si anode and n buffer.

Figure 6A:
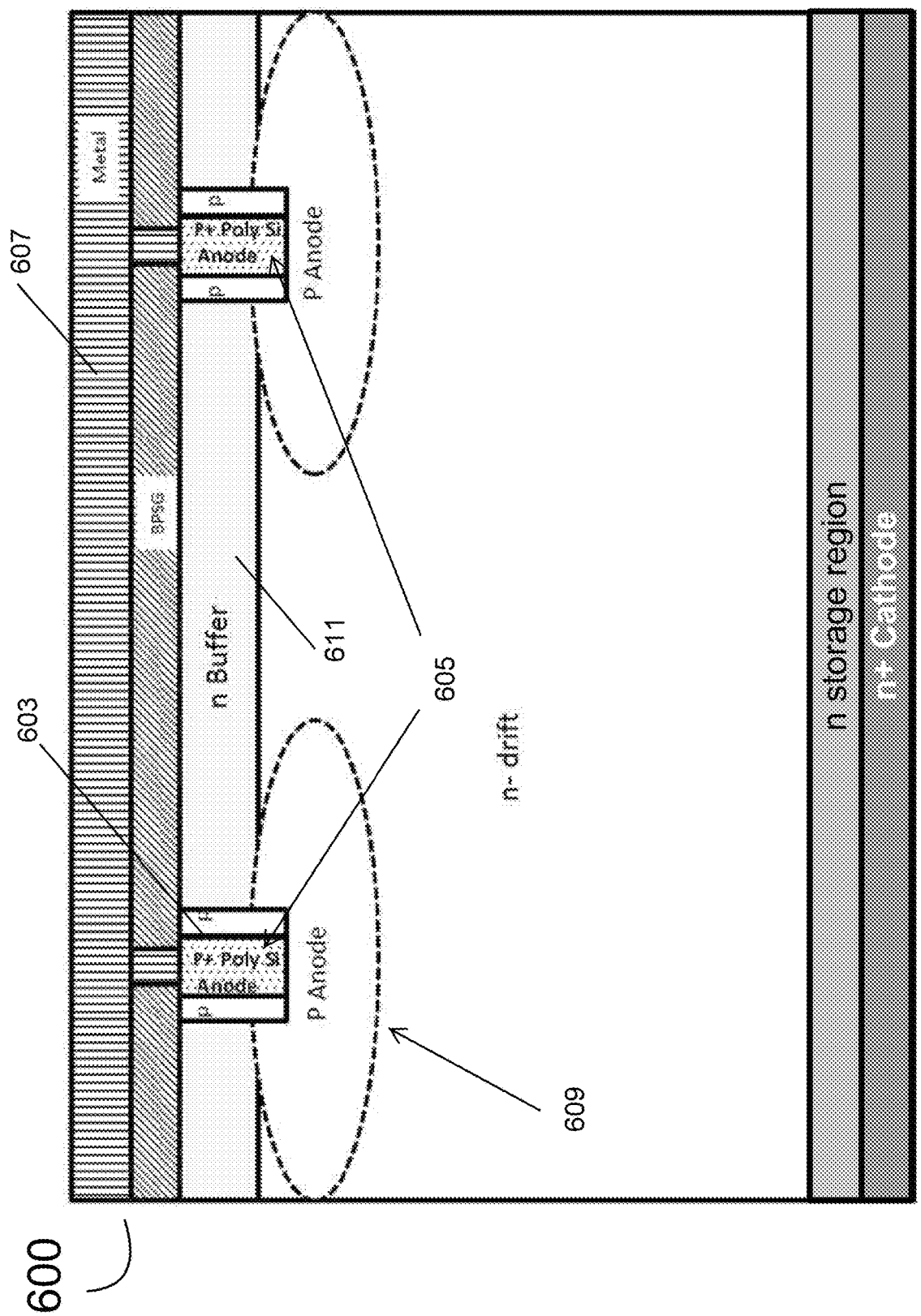
FIG. 6A illustrates another embodiment of the FRD structure having trenches filled with P+ poly Si as the anode to control carrier injection.

FIG. 6A illustrates another example embodiment 600 of the FRD structure having trenches 603 filled with P+ poly Si as the anode region 605 which is in contact with anode electrode 607 to control carrier injection. The trenches 603 are on top of a deep junctions 609, as shield regions, encircling the buffer region 611 and substantially spreading laterally beneath the buffer region 611.

In various embodiments, using poly silicon as an anode instead of crystalline silicon reduces minority carrier lifetime in the vicinity of P+ poly Silicon anode.

Figure 6B:
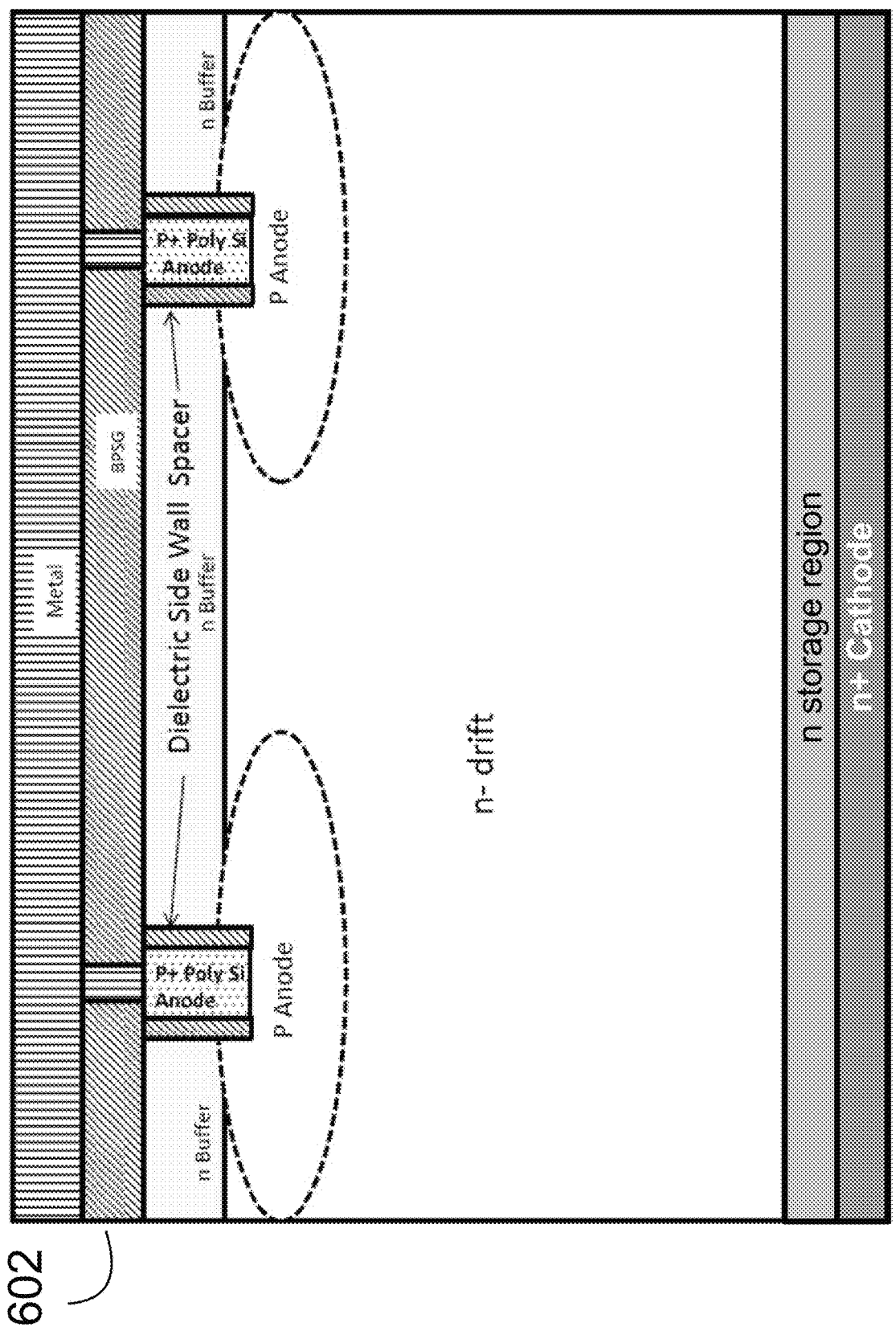
FIG. 6B illustrates another embodiment of the FRD structure having trenches filled P+ poly Si as an anode laterally isolated by dielectric side wall spacers.

FIG. 6B illustrates another example embodiment 602 of the FRD structure having trenches filled P+ poly Si as an anode laterally isolated by dielectric side wall spacers. In some embodiments, forming of the side wall spacers includes depositing or thermally growing oxide inside the trenches, and reactive-ion etching (RIE) etching the oxide from the bottom of the trenches before filling the trenches.

In various embodiments, filling trenches with P+ poly silicon reduces minority carrier lifetime in the vicinity of P+ poly Silicon and P anode region without increasing the leakage of the FRD during high voltage blocking mode, because depletion does not reach into the highly defective Poly Silicon regions which is guarded by P shield vertically and P anode.

Figure 6C:
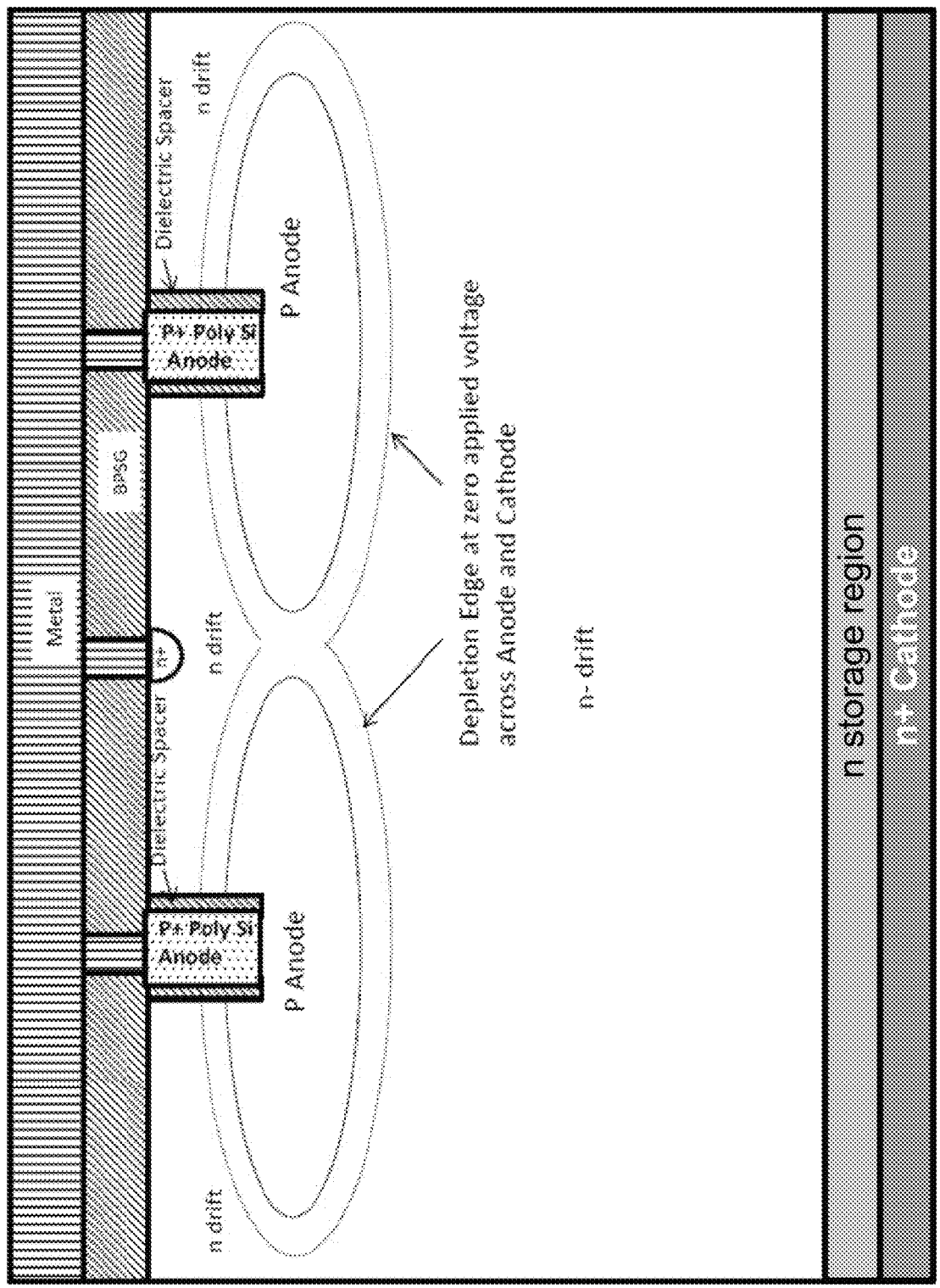
FIG. 6C illustrates another example embodiment of the FRD structure using Depletion Induced Barrier (DIB) FRD to achieve voltage blocking.

FIG. 6C illustrates another example embodiment 604 of the FRD structure using Depletion Induced Barrier (DIB) FRD to achieve high voltage blocking. In this example, the trenches are filled with P+ poly Si as the anode is laterally isolated by dielectric side wall spacers. The example embodiment 604 uses the trench filled P+ poly Si as an anode to inject holes and n+ regions electrically connected to the anode electrode. At zero bias voltage applied across the anode and cathode electrodes, for this example, there is an n drift region between the P anodes at the bottom of the poly Si filled trenches. For this completely depleted aspect in this example, the structure acts like an enhancement mode JFET in that the depletion region creates an Induced Potential Barrier, Depletion Induced Barrier (DIB) between n+ regions at the surface connected to the anode electrode and the cathode electrode to assure blocking of high voltage during reverse bias mode. According to this example embodiments, during forward bias mode, the depletion width, between the P anodes at the bottom of the poly filled trenches, shrinks and a JFET channel turns on thus allowing electrons from the cathode electrode to be collected by n+ regions connected to the anode electrode in addition to electrodes injected into the P anode regions. In example embodiments, the fact that some electrons are diverted away from the P anode to the n+ regions can minimize an Electron and Hole Pair (EHP) or simply charge storage in the vicinity of the P anode region which will reduce the time and the peak current during the reverse recovery of the FRD.

Figure 6D:
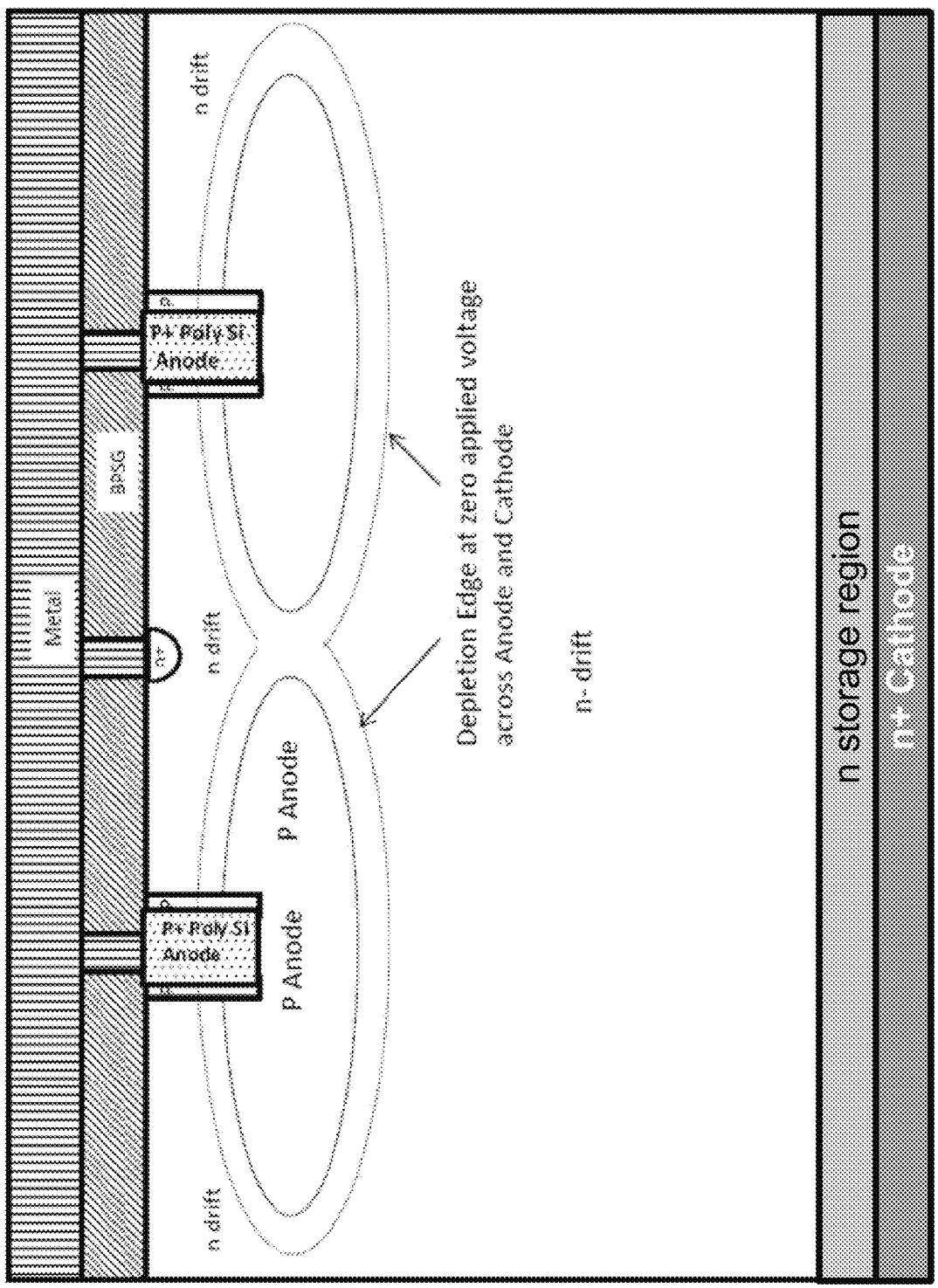
FIG. 6D illustrates another embodiment using Depletion Induced Barrier to achieve voltage blocking.

Even though FIG. 6C shows as an example of trench filled P+ poly Si with side wall dielectric spacers, a DIB FRD can be constructed by replacing dielectric side wall spacers with angle implanted p regions on the trench side walls to prevent depletion region to reach P+ poly silicon as shown in FIG. 6D.

FIG. 6D illustrates another embodiment 606 using Depletion Induced Barrier to achieve voltage blocking. Trenches filled with P+ Poly Si are enclosed by P type trench side walls in this example embodiment.

Figure 7A:
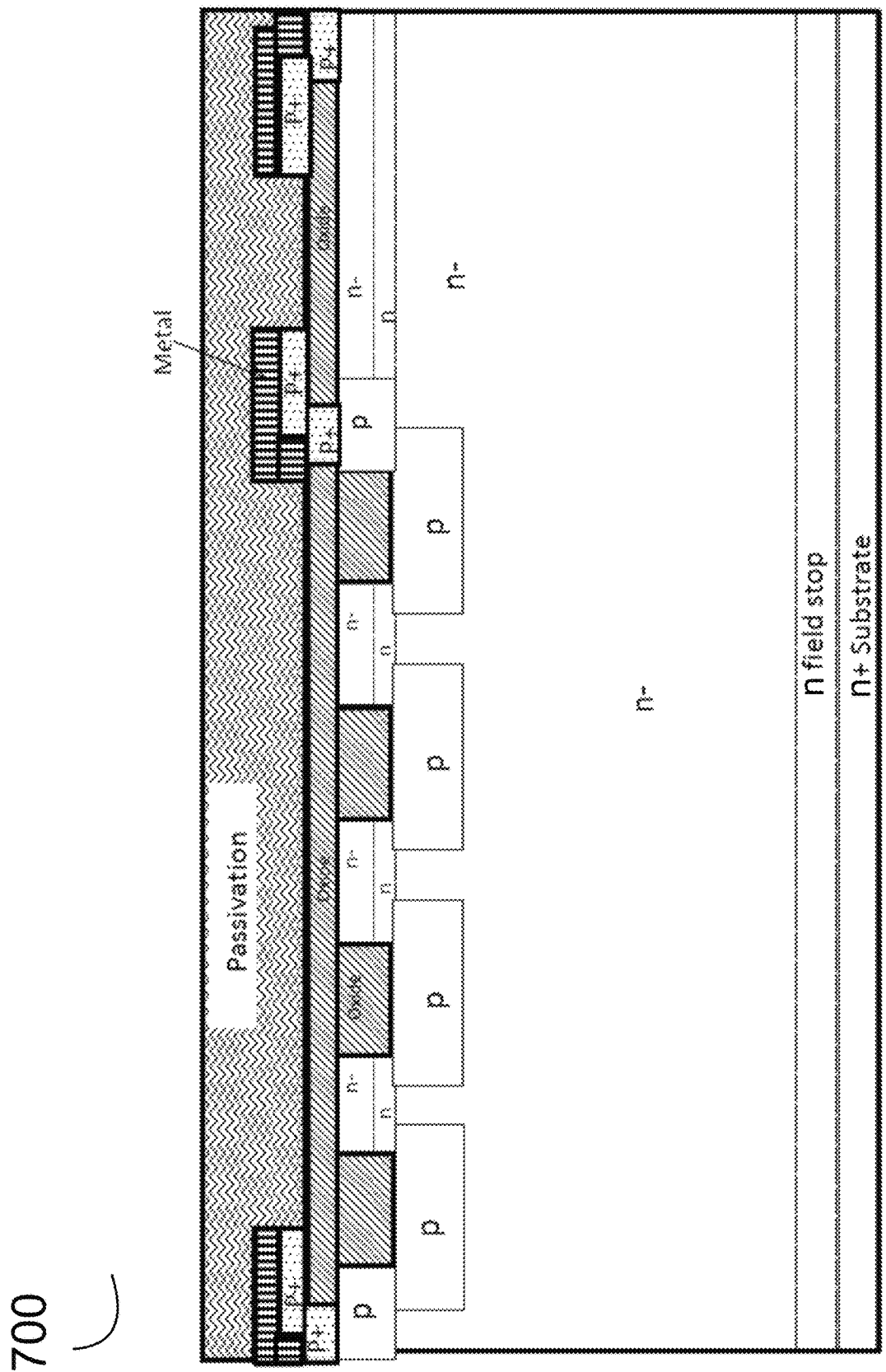
FIG. 7A and FIG. 7B show the edge termination structures for a CIC FRD, according to various embodiments.
Figure 7B:
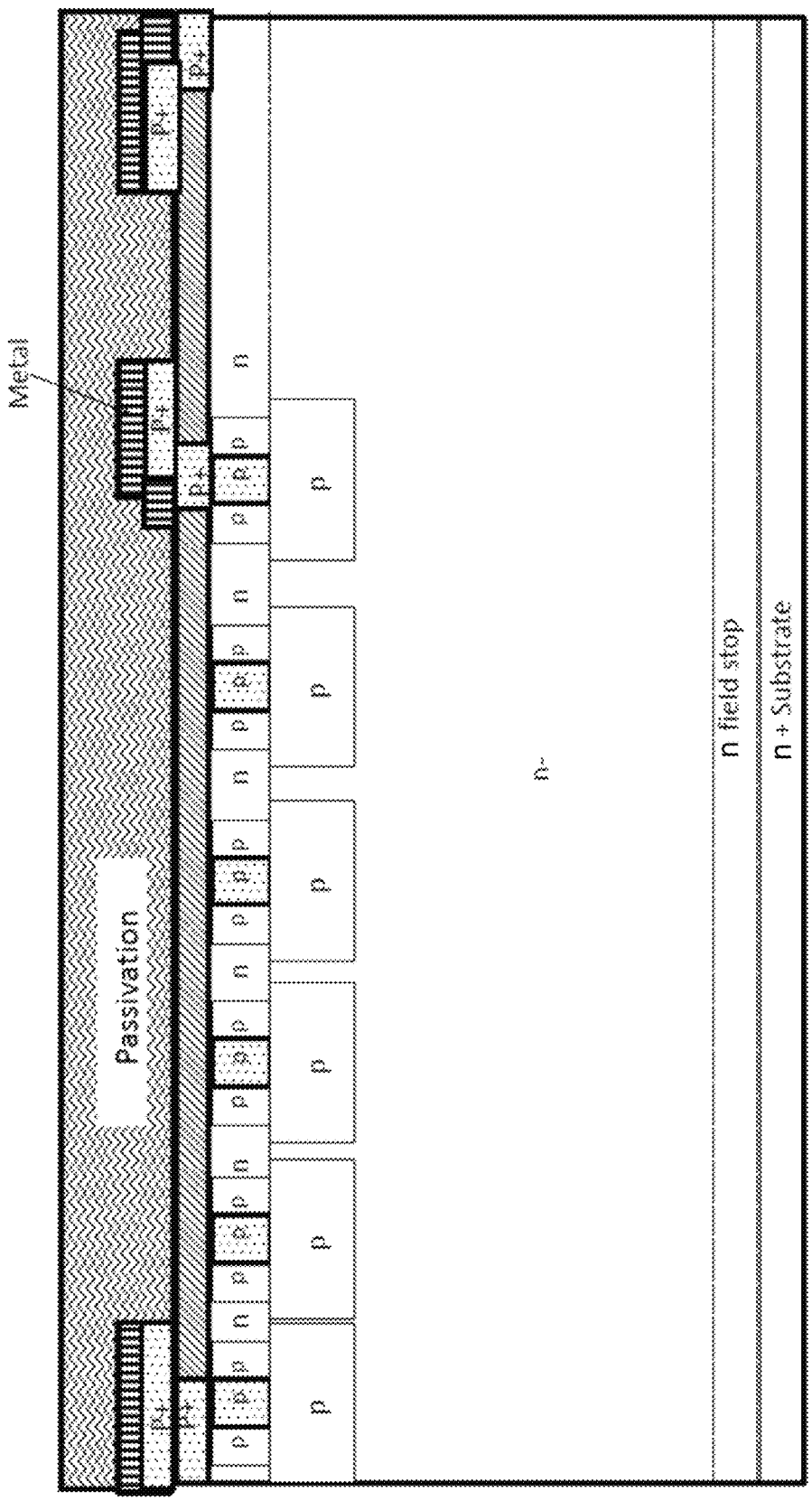

FIG. 7A and FIG. 7B show the edge termination structures 700 and 702 respectively for a CIC FRD, according to various embodiments.

Figure 8B:
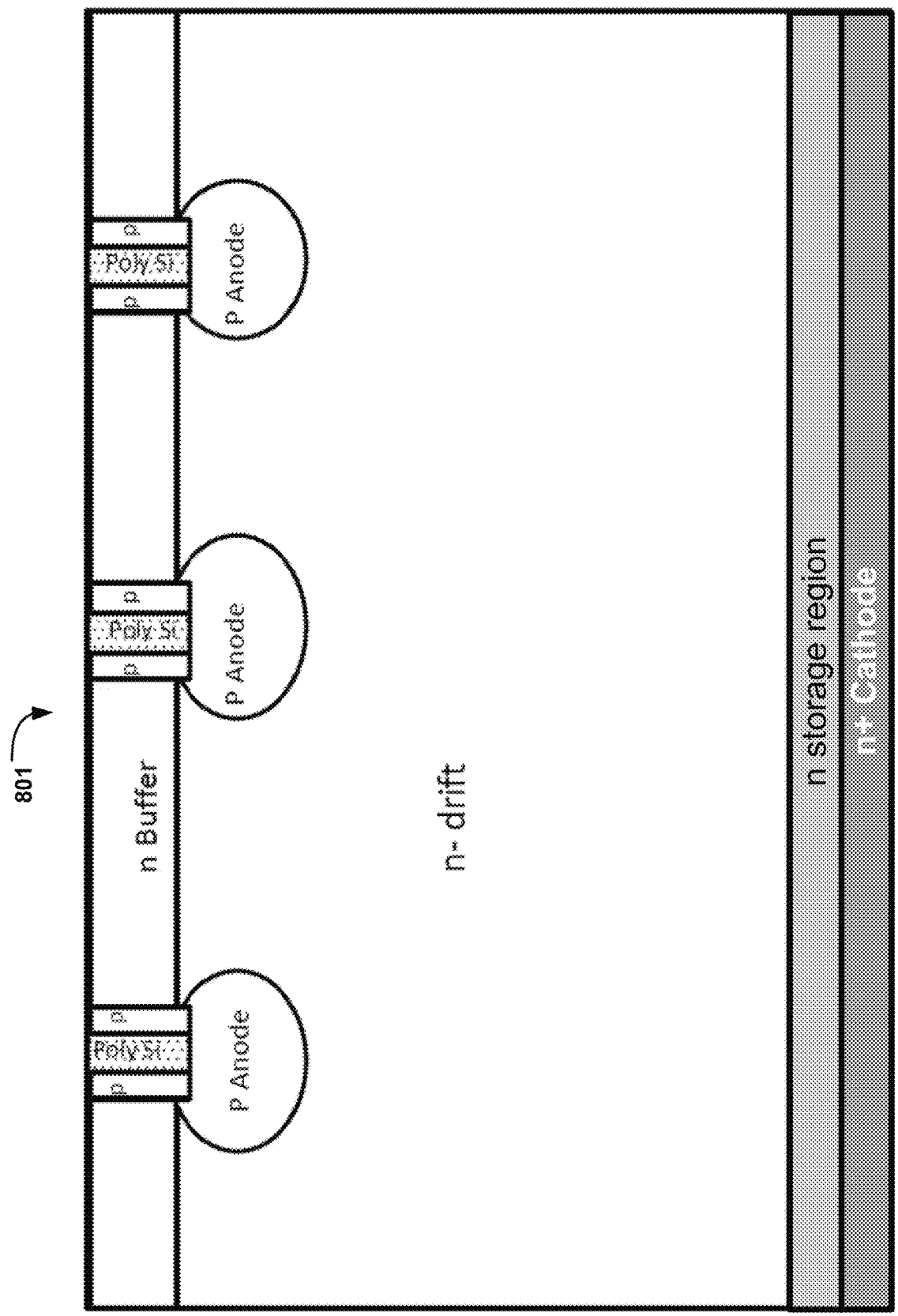

FIG. 8A-FIG. 8H illustrates various steps of an example 4 mask process 800 for an FRD with poly filled trench to control minority carrier lifetime, according to various embodiments. FIG. 8A illustrates that the example 4 mask process includes a Mask 801: Trench Mask/P Anode Implant; a Mask 802: Contact Mask (Oxide Deposition and Contact Opening); a Mask 803: P+ Poly/Metal Mask; and a Mask 804: Pad Mask (Deposit SiO2/Si3N4 and Poly-imide and Pad opening).

FIG. 8B illustrates an example Mask 801 being a trench mask (the active FRD region) having 2 to 4 microns depth and 0.5 to 1.0 micron wide trenches via a hard mask (SiO2/Si3Ni4). After trench etch, high energy Boron can be implanted to form a deep P anode. The trenches are filled in this example embodiment with un-doped or p doped poly Si and planarized, with removal of the trench hard mask.

Figure 8C:
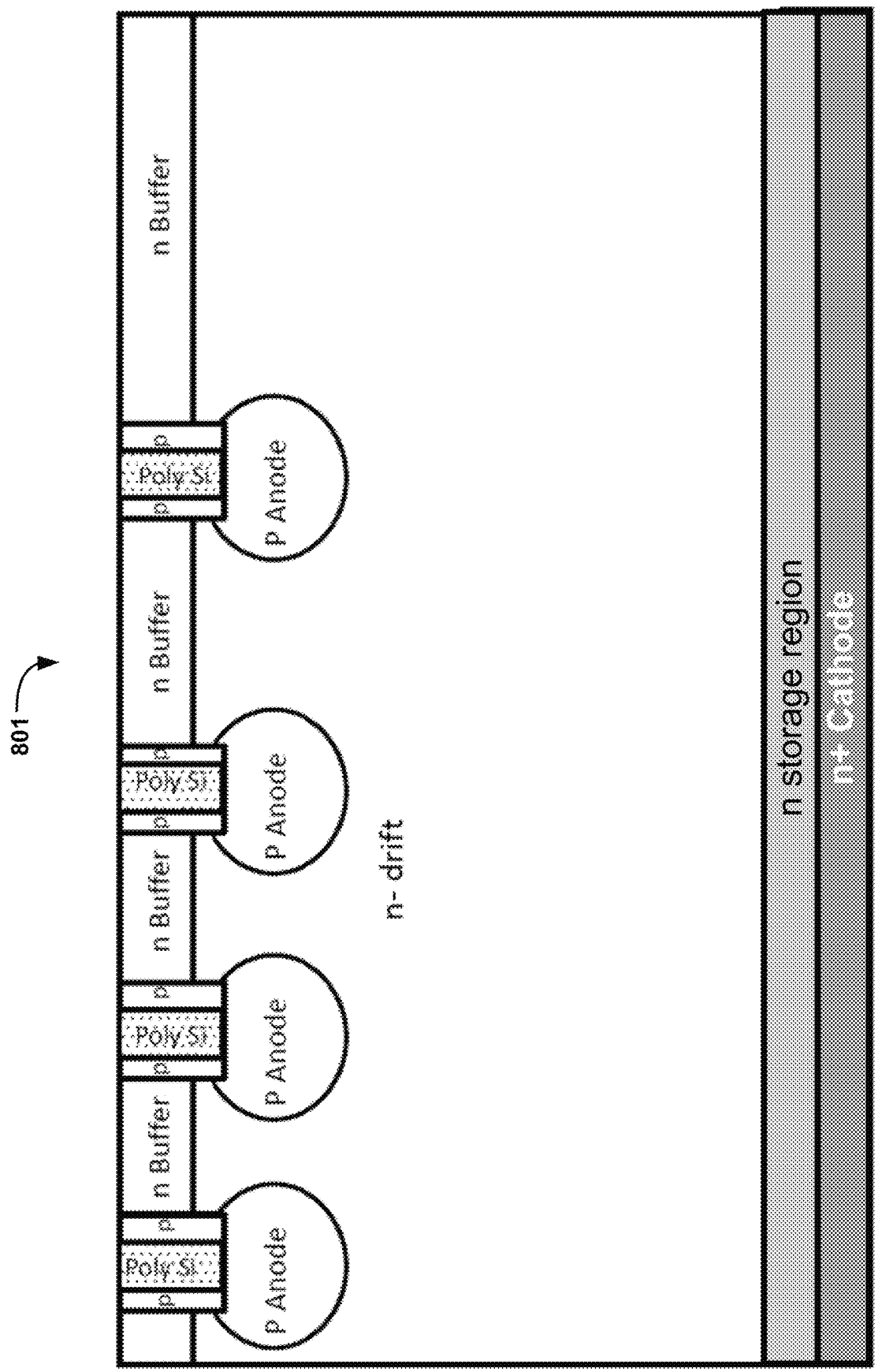

FIG. 8C illustrates an alternative embodiment of the example Mask 801: Trench Mask (the termination region). In this example process, there are 2 to 4 microns depth and 0.5 to 1.0 micron wide trenches formed via hard mask (SiO2/Si3Ni4); boron implanted ranging from 1E12 to 2e13 Cm-2 dose with multiple energy levels ranging from 30Kev up to 2 MeV to form deep P regions; angle implant to dope trench side walls P type. The trenches can be filled with un-doped or p doped Poly Si, along with planarizing and removing the trench hard mask.

FIG. 8D1 shows an example Mask 802, of FIG. 8A, which is a contact mask (the active FRD region). This includes in this example, depositing BPSG and defining contact regions, according to some embodiments.

FIG. 8D2 shows an alternative embodiment of the example Mask 802, of FIG. 8A, which is a contact mask (the active FRD region), according to an alternative embodiments. For these alternate embodiments, the process includes depositing BPSG and defining contact regions, along with implanting boron for a shallow P-Anode.

Figure 8E:
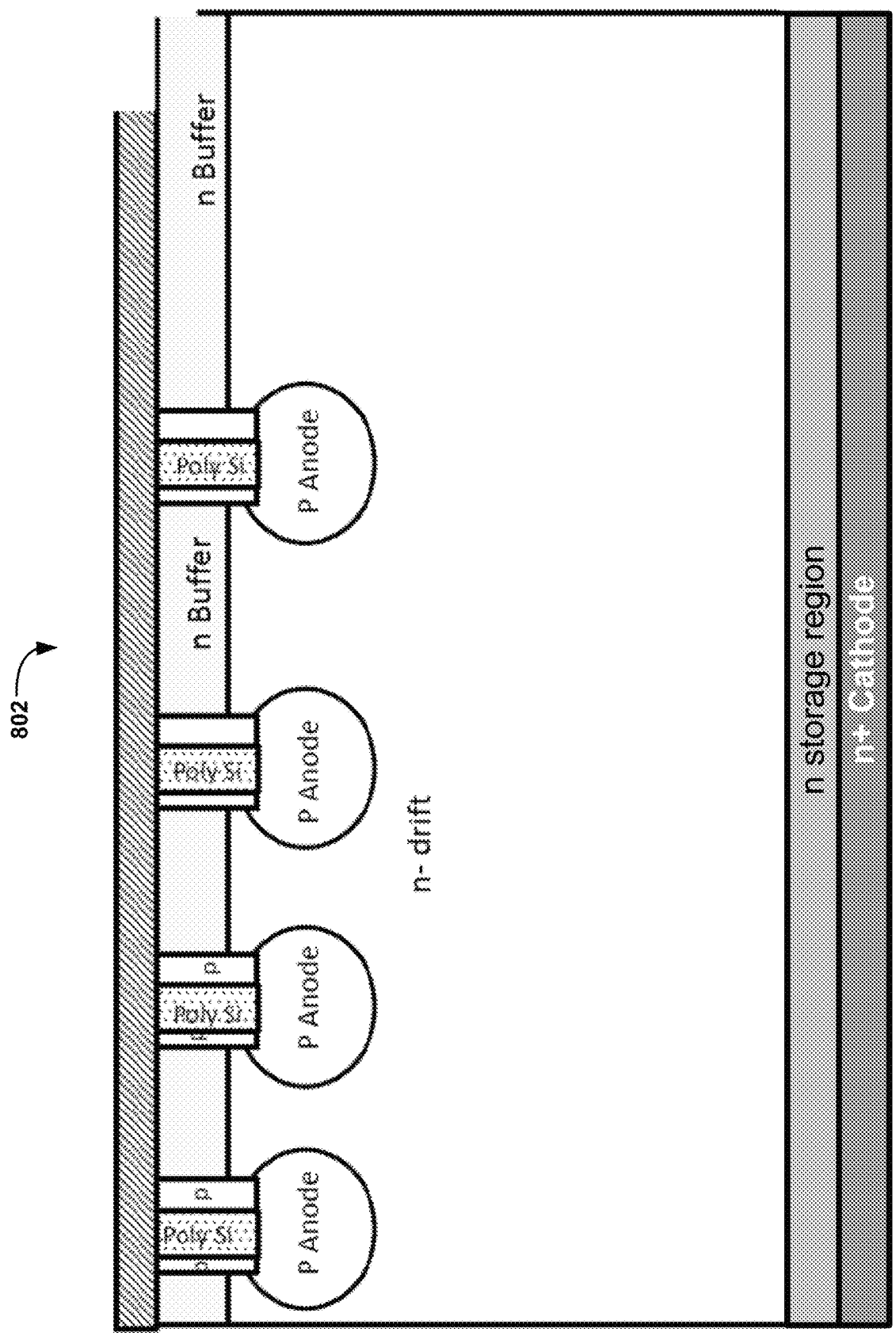

FIG. 8E shows an alternative embodiment of the example Mask 802 being a contact mask (termination region), according to some embodiments. For FIG. 8E, the process includes depositing BPSG and defining contact regions.

FIG. 8F1 illustrates an example Mask 803, of FIG. 8A, that is a Poly/Metal Mask (Active FRD Region), according to some embodiments. For the example in FIG. 8F1, the process includes depositing poly Si and implanting boron as an anode to control hole injection, plus depositing metal and etching off the metal and poly Si from the defined regions.

FIG. 8F2 shows an alternative embodiment of the example Mask 803, poly/metal mask for an alternative embodiments of the active FRD region. For the example in FIG. 8F2, the process includes depositing poly Si and implanting boron as an anode to control hole injection, and depositing metal and etching of the metal and poly Si from the defined regions.

FIG. 8F3 shows another example an alternative embodiment of the Mask 803, poly/metal mask for another alternative embodiments of the active FRD region. For the example in FIG. 8F3, the process includes filling the trenches with the poly Si, planarizing and implanting Boron after Mask 801 as an anode to control hole injection; depositing metal (Al:Si:Cu) and etching off the metal.

Figure 8G:
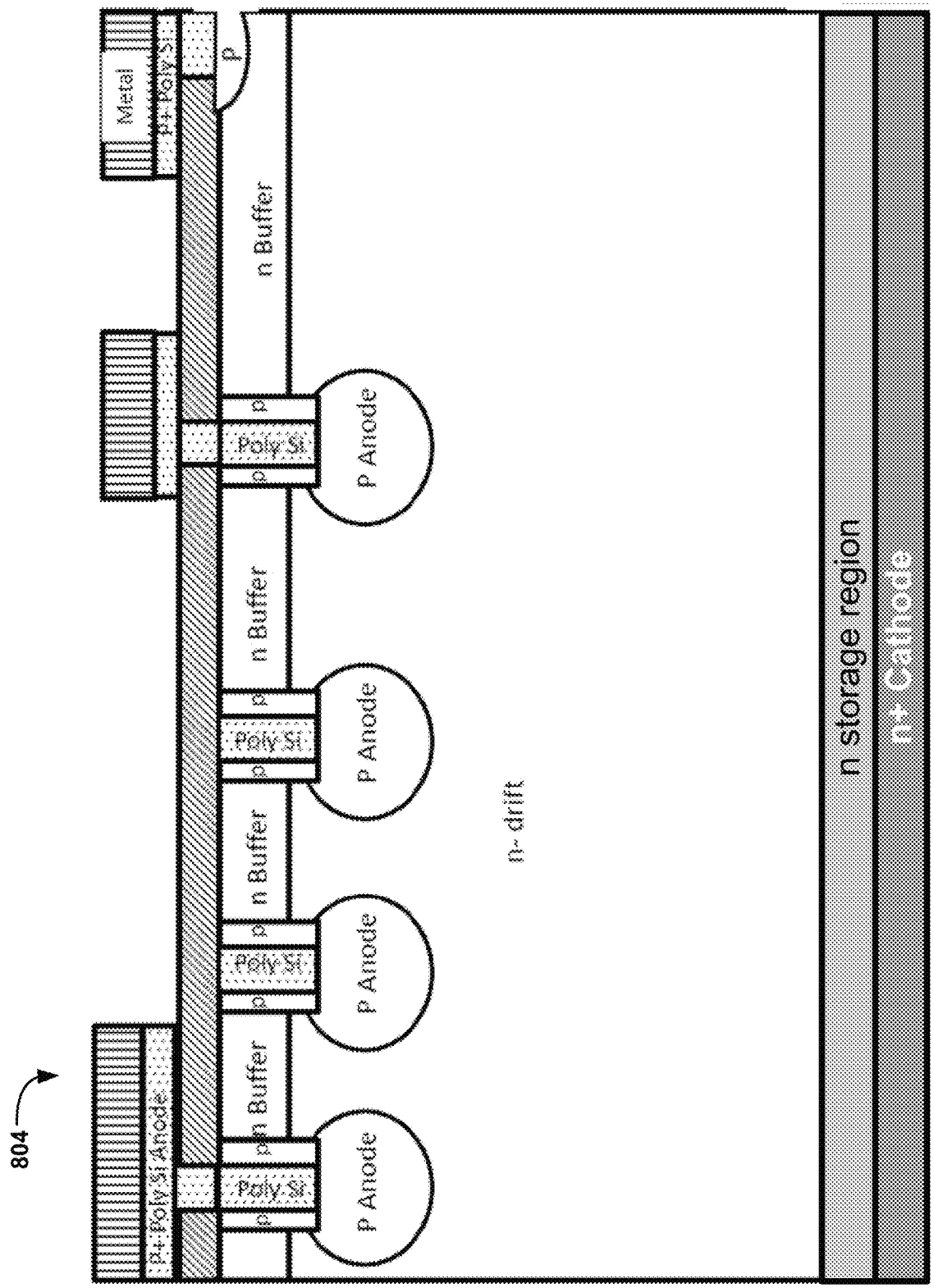

FIG. 8G illustrates another example of an alternative embodiment of the example Mask 803, poly/metal mask (termination region). For the example in FIG. 8G, the process includes depositing poly Si and implanting Boron as an anode, and depositing metal and etching off the metal and poly Si from the defined regions.

Figure 8H:
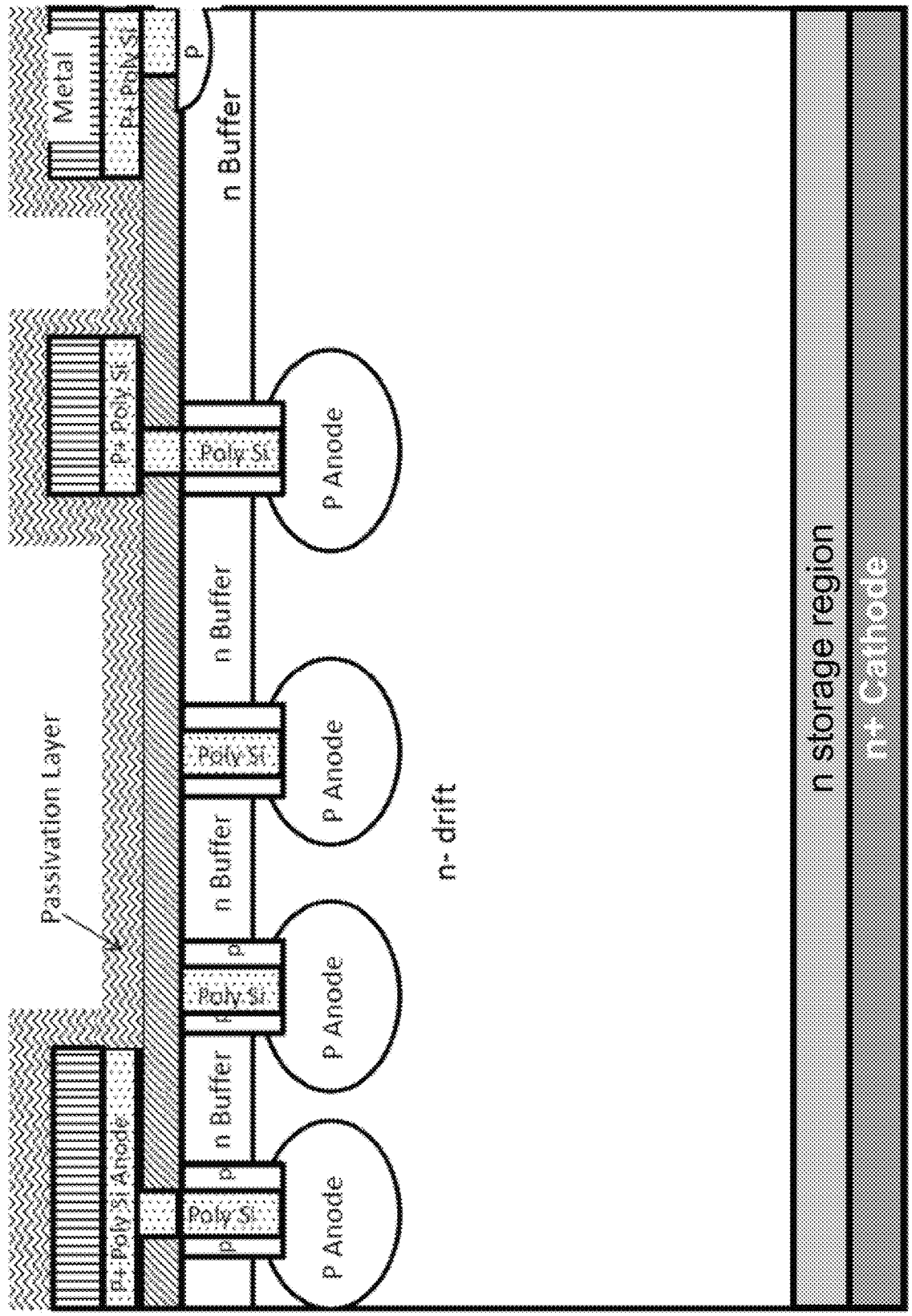

FIG. 8H illustrates Mask 804, of FIG. 8A, passivation mask (termination region), according to some embodiments. For the example passivation mask in FIG. 8H, the process includes depositing poly Si and implanting Boron as an anode, and depositing metal and etching off the metal and poly Si from the defined regions.

Figure 8I:
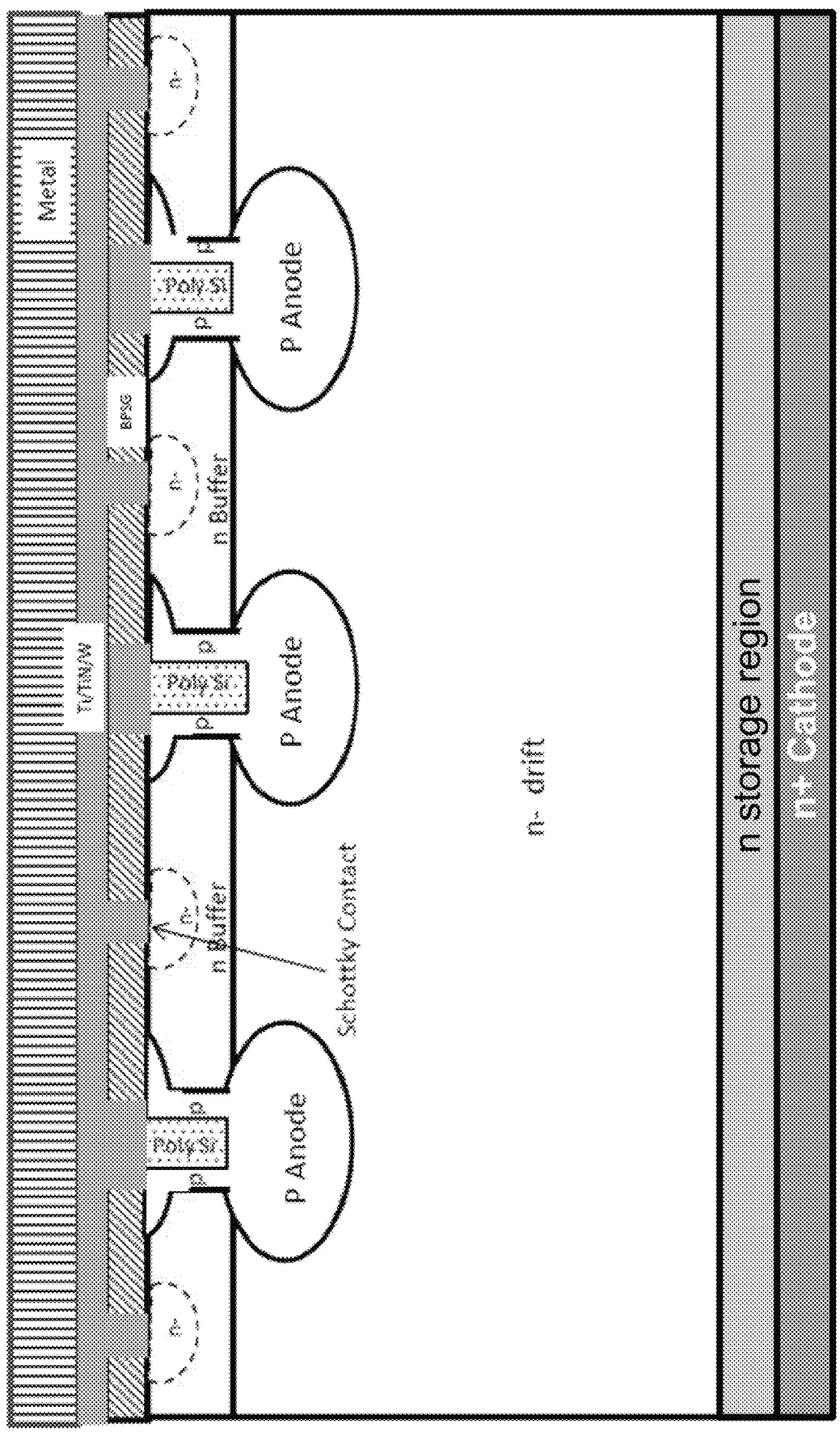
FIG. 8I illustrates a Hybrid Schottky and Junction FRD (HSJ FRD) with P poly filled trenches, according to an example embodiment.

FIG. 8I illustrates a Hybrid Schottky and Junction FRD (HSJ FRD) with P poly filled trenches, according to an example embodiment. For the example in FIG. 8I, the process includes, after contact mask open in Poly filled trench and n buffer regions, implanting a Boron dose in the range from 1e11 to 5e12 Cm-2 to adjust Schottky barrier height; depositing Ti/TiN/W or Ti/Ni type Schottky metal; depositing metal (Al:Si:Cu) and etching off the metal, and a 4 mask process, according to various embodiments.

In various embodiments, in addition to controlling the hole and electron injection by P+ poly Si anode doping, n+ poly Si cathode and the n buffer doping concentration, localized minority carrier lifetime reduction can be achieve by creating poly Silicon filled trenches as recombination centers. The process flow as shown in the examples in FIGS. 8A-8H for a minority carrier lifetime reduced by using P poly filled trench type various FRD structures. According to various embodiments, one of the benefits of localized low minority carrier lifetime is to reduce carrier storage in the vicinity of the anode region and speed up reverse recovery of the FRD from the on state to the off state without increasing the high voltage leakage, because depletion does not reach into the region with reduced minority carrier lifetime, in other words, the poly silicon region.

Figure 9:
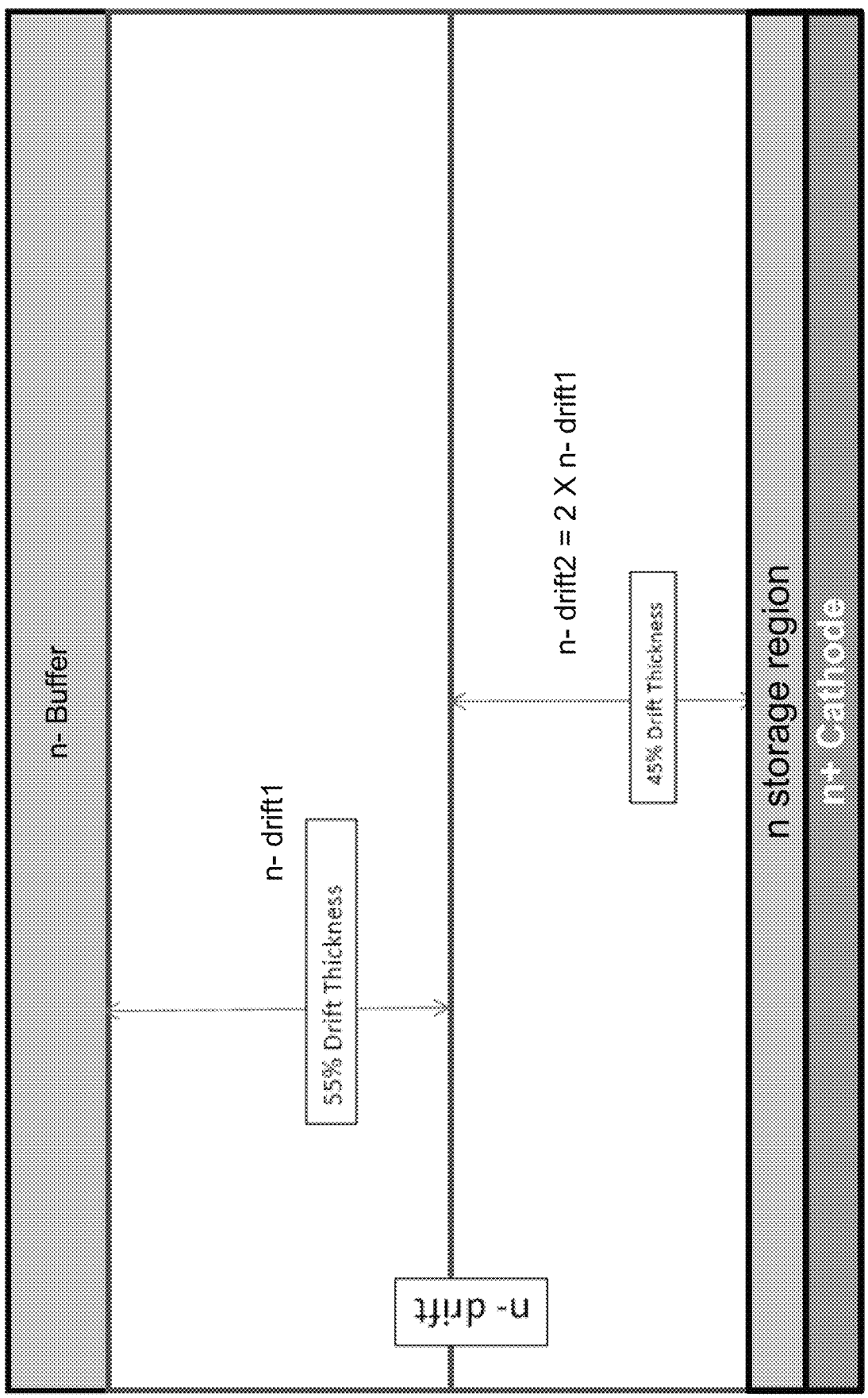
FIG. 9 shows an example of epitaxial wafer cross section with drift region including segments having varying doping concentrations and thicknesses for various FRD structures.

FIG. 9 shows an example of epitaxial wafer cross section with drift region including segments having varying doping concentrations and thicknesses for various FRD structures. The cross section may include a 0.5 to 2 microns thick n buffer region with doping ranging from 1e14 Cm-3 to 5e16 Cm-3; an n drift region between n buffer and n storage regions, containing two or more sub-regions with doping level increasing from the upper portion towards the n+ Substrate, according to example embodiments.

FIG. 10A-FIG. 10F shows example steps of a 5 mask process 1000. This example 5 mask process has an FRD with P+ poly Si filled trenches and n buffer regions formed in the active FRD regions but prevent it from high voltage termination regions to ensure FRD breakdown occurs within the active region, not in high voltage termination, according to various embodiments.

The 5 mask process of the example in FIG. 10A includes Mask 1001: n Buffer Mask; Mask 1002: Trench Mask/P Anode Implant; Mask 1003: Contact Mask; Mask 1004: Metal Mask; and Mask 1005: Pad Mask.

Figure 10B:
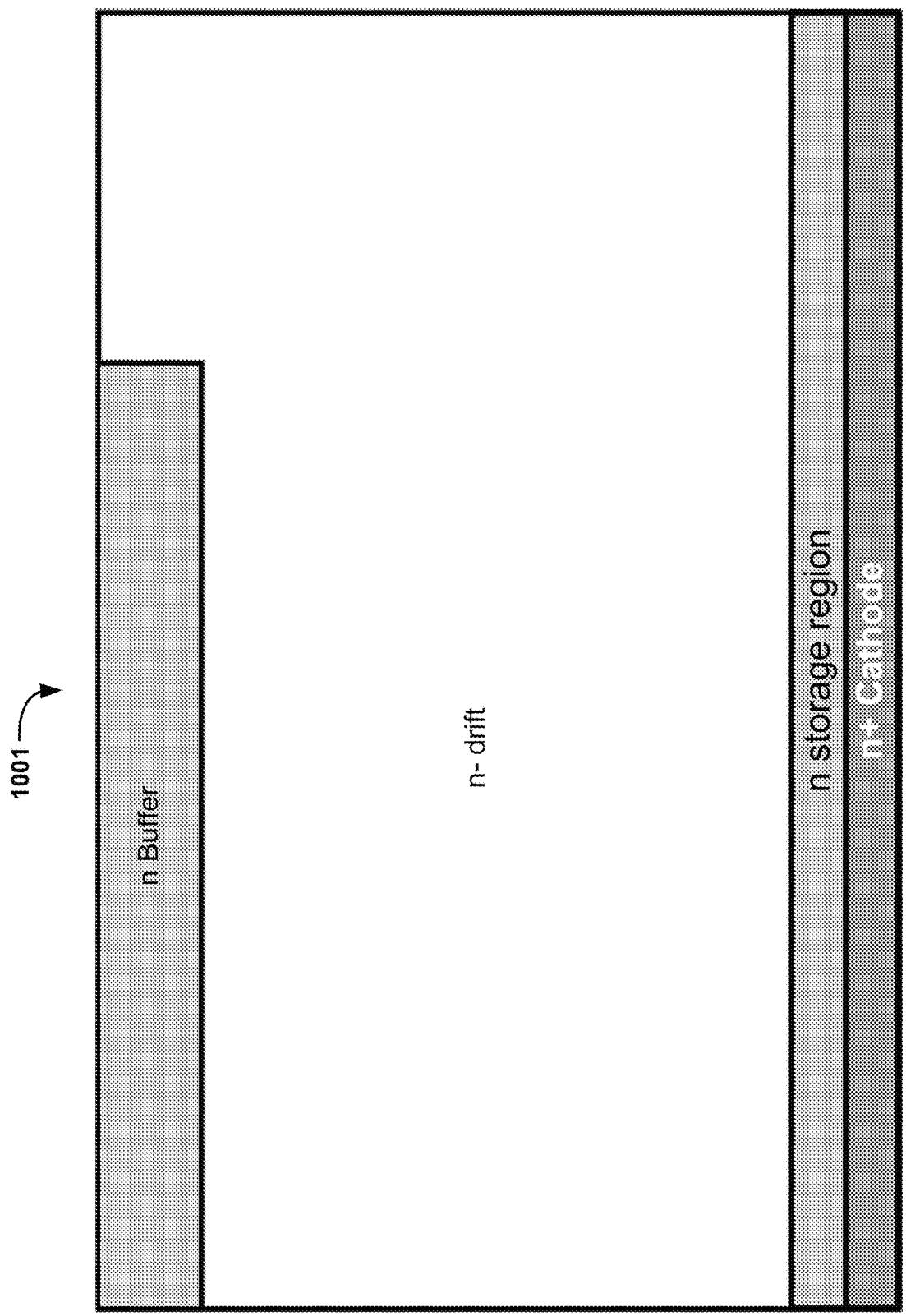

FIG. 10B illustrates aspects of the process for Mask 1001 of the 5 mask process, according to various embodiments. In the example in FIG. 10B, an n buffer is implanted via Mask 1001 to block the termination region; having a 2 to 4 microns thick n buffer region with doping ranging from 1e14 Cm-3 to 5e16 Cm-3 by phosphorus implant.

Figure 10C:
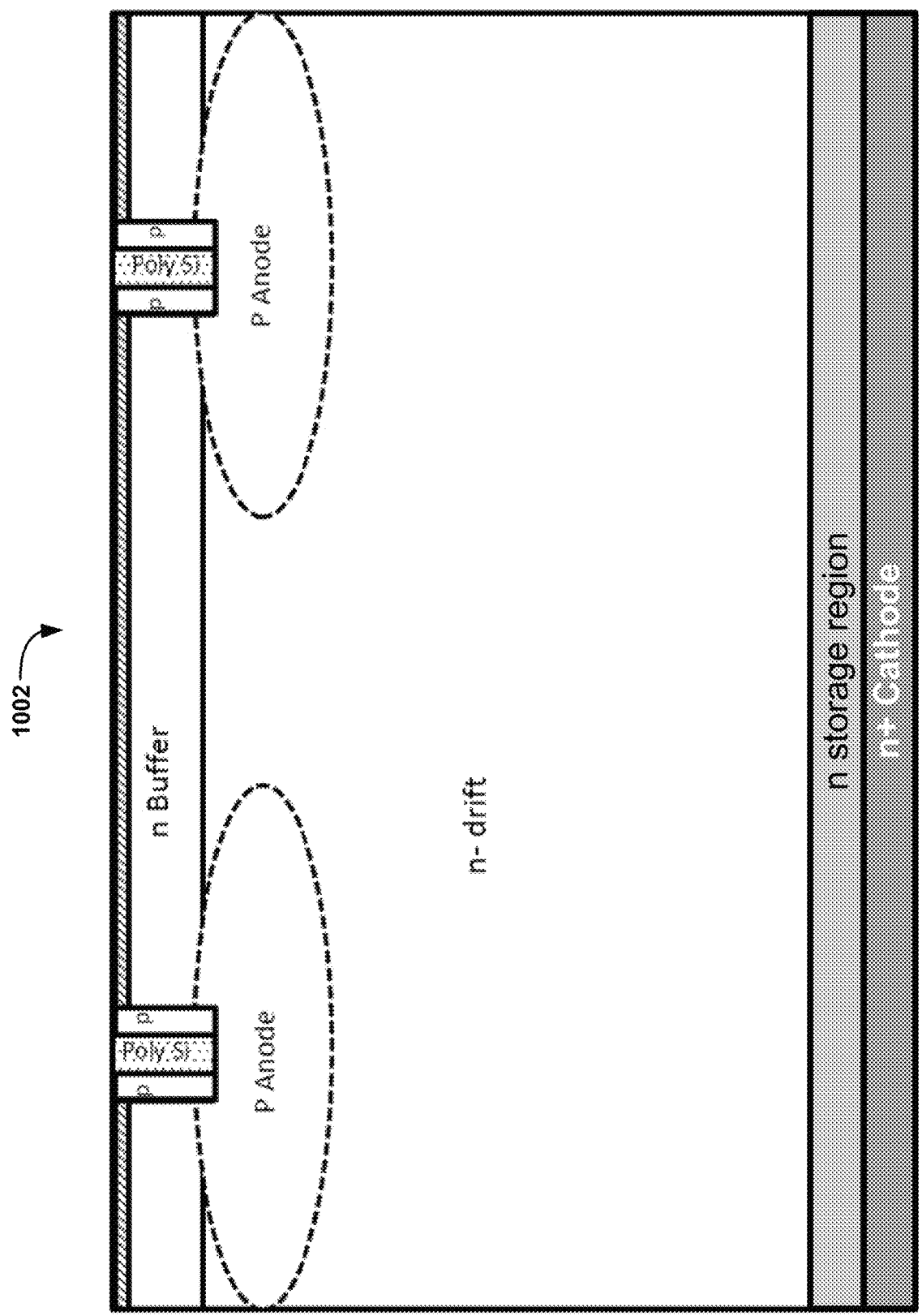

FIG. 10C illustrates aspects of the process for Mask 1002 of the 5 mask process, according to various embodiments. In the example in FIG. 10C, Mask 1002 is a trench Mask (active FRD region). For the example Mask 1002 in FIG. 10C, the process includes forming 2 to 4 microns depth and 0.5 to 1.0 micron wide trenches via a hard mask (SiO2/Si3Ni4); after trench etch, implanting high energy Boron to form a deep P anode; and filling the trenches with doped poly Si and planarizing and removing the trench hard mask.

Figure 10D:
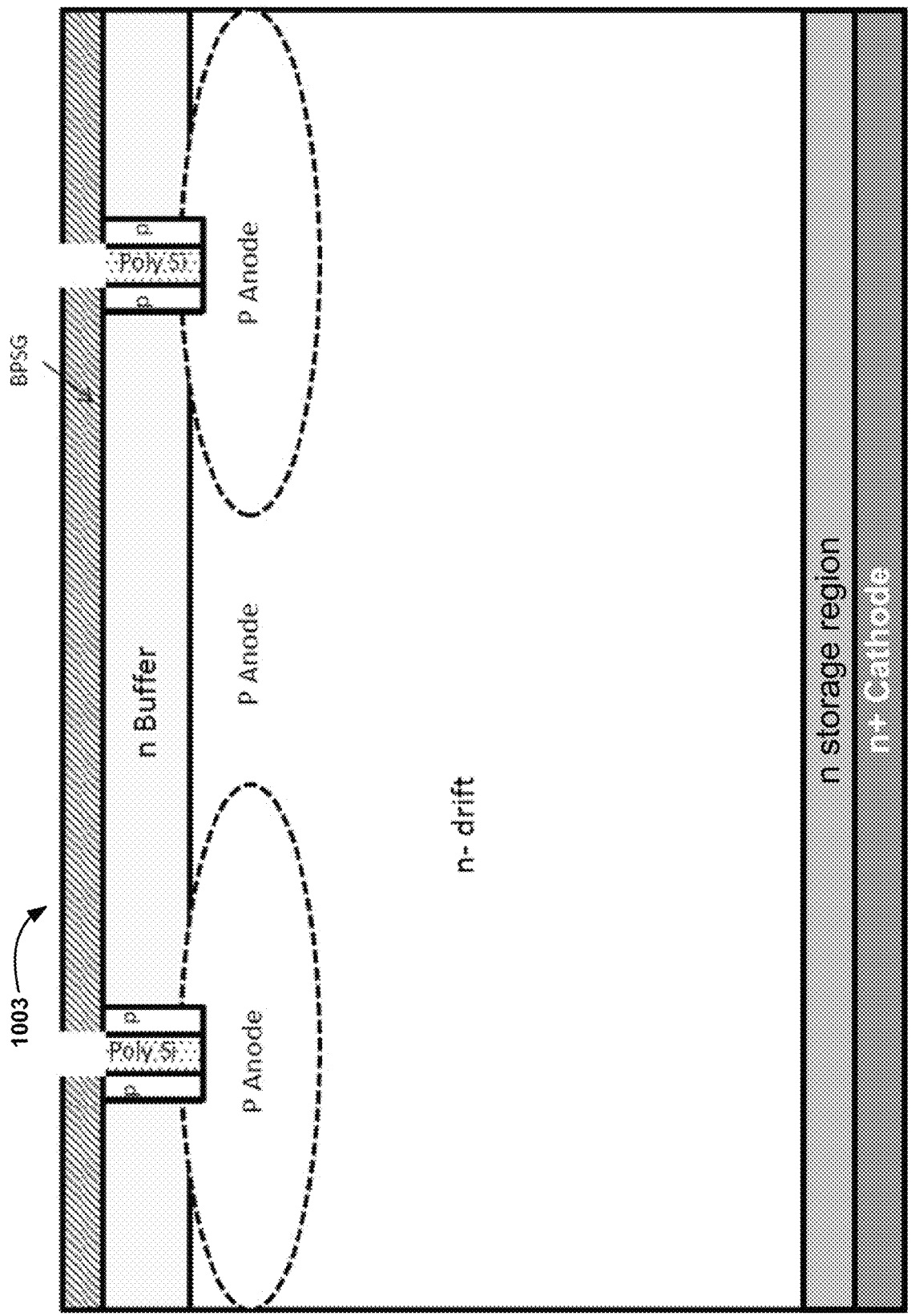

FIG. 10D illustrates aspects of the process for Mask 1003 of the 5 mask process, according to various embodiments. In the example in FIG. 10D, Mask 1003 is a contact mask (active FRD region). For the example Mask 1003 in FIG. 10D, the process includes depositing 0.4 to 1.0 micron thick BPSG; after trench etch, implanting high energy Boron to form a deep P anode; defining contact openings via Mask 1003; and doing these steps after the contact mask, the metal and pad process steps are completed, according to various embodiments.

Figure 10E:
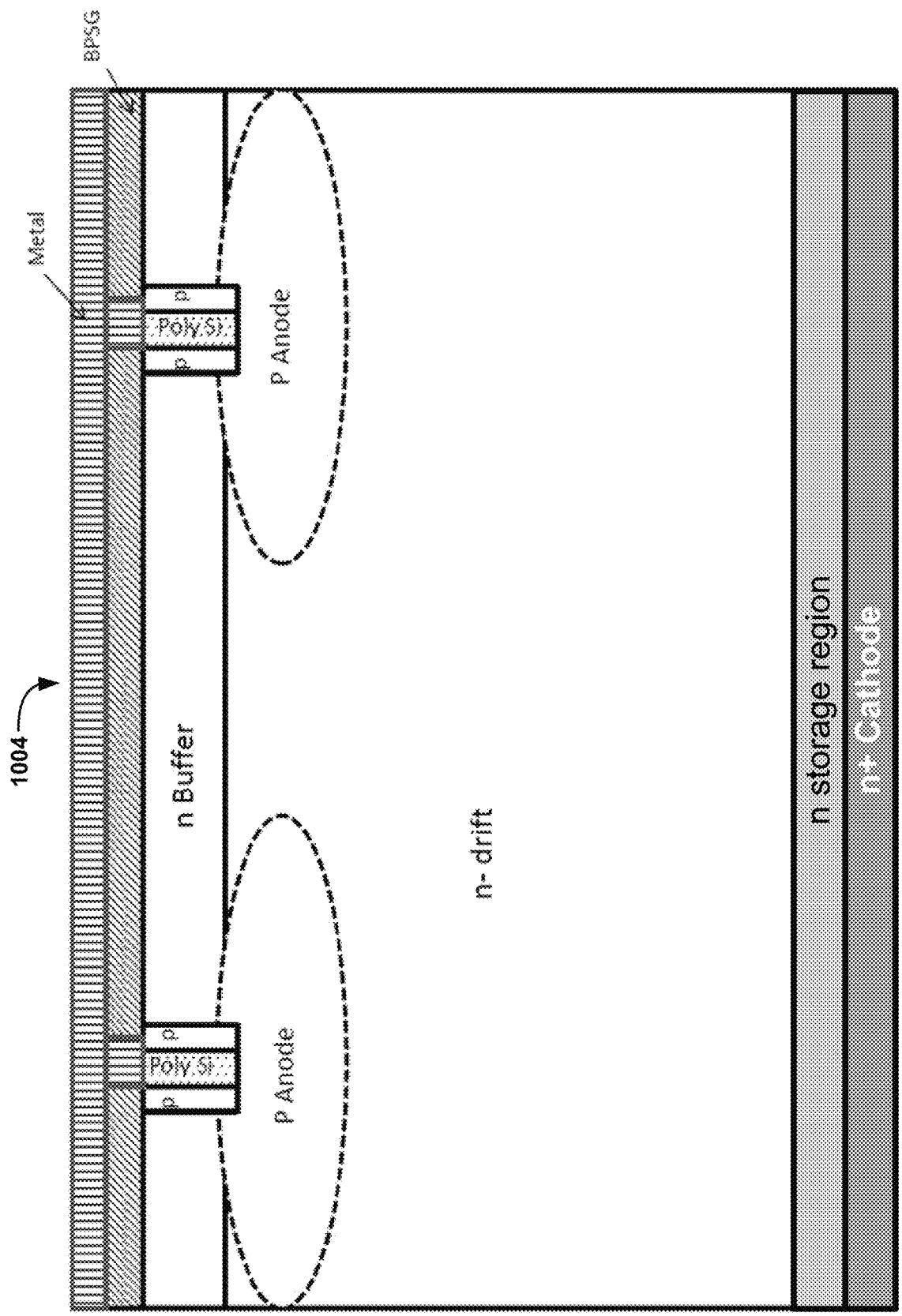

FIG. 10E illustrates aspects of the process for Mask 1004 of the 5 mask process, according to various embodiments. In the example in FIG. 10E, Mask 1004 is a metal mask (active FRD region). For the example Mask 1004 in FIG. 10E, the process includes depositing 0.4 to 1.0 micron thick BPSG;

after trench etch, implanting high energy Boron to form a deep P anode; defining contact openings via Mask 1003; and doing these steps after the contact mask, metal and pad process steps are completed.

Figure 10F:
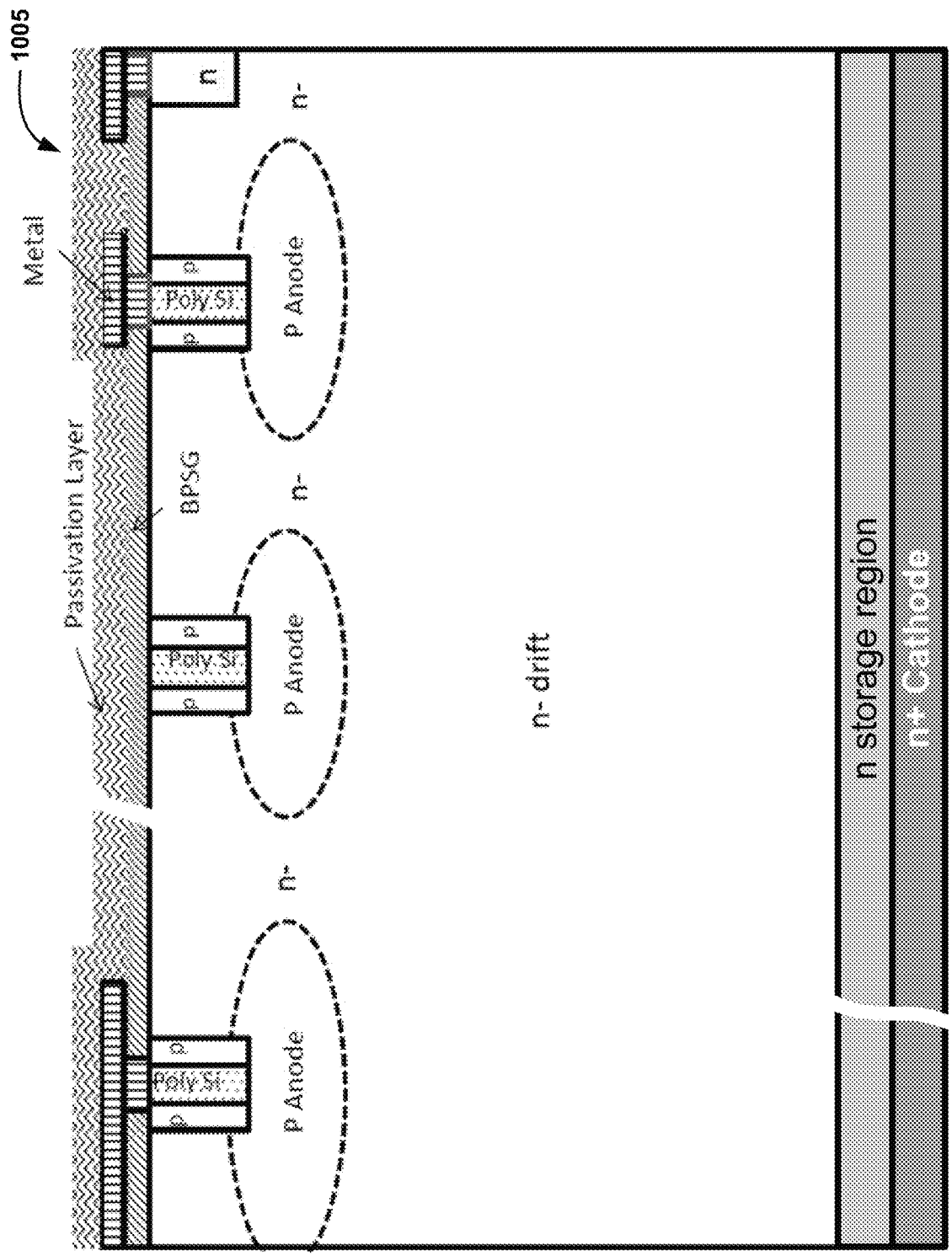

FIG. 10F illustrates aspects of the process for Mask 1005 of the 5 mask process, according to various embodiments. In the example in FIG. 10F, Mask 1005 is a pad mask (HV termination region). For the example Mask 1005 in FIG. 10F, the process includes depositing 0.5 to 1.0 micron thick SiO2/Si3N4 and 5 to 10 microns thick Polyimide as a passivation layer; defining pads via Mask 1005; where the termination will have many more floating field rings according to various embodiments.

The description of the present technology has been presented for purposes of illustration and description, but is not intended to be exhaustive or limited to the invention in the form disclosed. Many modifications and variations will be apparent to those of ordinary skill in the art without departing from the scope and spirit of the invention. Exemplary embodiments were chosen and described in order to best explain the principles of the present technology and its practical application, and to enable others of ordinary skill in the art to understand the invention for various embodiments with various modifications as are suited to the particular use contemplated.

What is claimed is:

1. A semiconductor device, comprising:
   a first conductivity type semiconductor substrate;
   a drift region formed on top of the first conductivity type semiconductor substrate to support blocking of high voltage, the drift region being of a first conductivity type, the drift region comprising:
   a medium level doped buffer region on top,
   a lightly doped middle region, and
   a medium level doped field stop region or carrier storage region;
   a shield region of a second conductivity type, the shield region comprising a deep junction encircling the medium level doped buffer region of the drift region; and
   a second conductivity type shallow junction anode region in electrical contact with an anode electrode of the second conductivity type.

2. The semiconductor device of claim 1, wherein the semiconductor device is a Charge Injection Control (CIC) Fast Recovery Diode (FRD) for controlling charge injection by lowering carrier storage rather than reducing minority carrier lifetime.

3. The semiconductor device of claim 2, wherein the medium level doped buffer region on top is of the active FRD region only.

4. The semiconductor device of claim 2, wherein the CIC FRD semiconductor device further comprises dielectric spacers laterally isolating the poly silicon filled trenches.

5. The semiconductor device of claim 2, wherein the CIC FRD semiconductor device further comprises:
   an active FRD region, and
   a high voltage termination region surrounding the active FRD area, the high voltage termination region comprising a plurality of floating rings of additional poly silicon filled trenches on top of the second conductivity type shield region, increasing spacing with the buffer region being other than medium level doped buffer region.

6. The semiconductor device of claim 1, wherein the shield region further comprises poly silicon of the second conductivity type, the deep junction and the second conductivity type poly silicon encircling the medium level doped buffer region.

7. The semiconductor device of claim 1, wherein the shield region further comprises an oxide filled trench, the deep junction and the oxide filled trench encircling the medium level doped buffer region.

8. The semiconductor device of claim 1, further comprising a deep shield junction substantially spreading laterally beneath the first conductivity type buffer region.

9. The semiconductor device of claim 1, wherein:
   the medium level doped buffer region has a doping concentration ranging from 1e17Cm-3 to 2e14 Cm-3;
   the lightly doped middle region has a doping concentration ranging from 1e13 Cm-3 to 5e14 Cm-3; and
   the medium level doped field stop region or carrier storage region has a doping concentration ranging from 1e17Cm-3 to 2e14 Cm-3.

10. The semiconductor device of claim 1, further comprising an anode contact smaller than the second conductivity type shallow junction anode region, the anode contact for connecting to the anode electrode, the anode electrode being a second conductivity type heavily doped poly silicon anode electrode.

11. The semiconductor device of claim 1, further comprising an anode contact for connecting to the anode electrode, the anode contact being substantially equal in size to the second conductivity type shallow junction anode region.

12. The semiconductor device of claim 1, further comprising a cathode electrode in electrical contact with the first conductivity substrate.

13. The semiconductor device of claim 1, wherein the first conductivity type is N type and the second conductivity type is P type.

14. The semiconductor device of claim 1, wherein the lightly doped middle region of the drift region including segments having varying doping concentrations and thicknesses for various FRD structures.

15. A semiconductor device having top and bottom surfaces, comprising:
   a drift region of a first conductivity type, the drift region comprising a buffer region at the top, a lightly doped middle region, and a medium level doped charge storage region, the drift region being for blocking voltage and being formed on top of semiconductor substrate of the first conductivity type;
   a shield region of a second conductivity type, the shield region comprising poly silicon filled trenches of the second conductivity type, the poly silicon filled trenches being on top of a deep junction encircling the buffer region of the drift region, the deep junction substantially spreading laterally beneath the buffer region;
   an anode region, of the second conductivity type poly silicon, in electrical contact with an anode electrode; and
   a substrate of the first conductivity type in electrical contact with a cathode electrode.

16. The semiconductor device of claim 15,
   wherein the poly silicon filled trenches, of the second conductivity type, are on top of the deep junction encircling the buffer region and an upper portion of the drift region, and
   wherein the poly silicon filled trenches, of the second conductivity type, are in electrical contact with the anode electrode.

17. The semiconductor device of claim 15, further comprising poly silicon filling trenches of the second conductivity type being in electrical contact with an anode electrode.

18. The semiconductor device of claim 15, wherein the first conductivity type is N type and the second conductivity type is P type.

19. The semiconductor device of claim 15, further comprising a Schottky contact formed on the surface of the buffer region surrounded on two or all sides by the shield region for forming a hybrid schottky and junction Fast Recovery Diode (HSJ FRD).

* * * * *